United States Patent
Ypma et al.

(10) Patent No.: US 10,539,882 B2
(45) Date of Patent: Jan. 21, 2020

(54) METHODS AND APPARATUS FOR OBTAINING DIAGNOSTIC INFORMATION, METHODS AND APPARATUS FOR CONTROLLING AN INDUSTRIAL PROCESS

(71) Applicant: ASML NETHERLANDS B.V., Veldhoven (NL)

(72) Inventors: Alexander Ypma, Veldhoven (NL); Adrianus Cornelis Matheus Koopman, Hilversum (NL); Scott Anderson Middlebrooks, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/322,148

(22) PCT Filed: Jul. 14, 2017

(86) PCT No.: PCT/EP2017/067840
§ 371 (c)(1),
(2) Date: Jan. 31, 2019

(87) PCT Pub. No.: WO2018/024466
PCT Pub. Date: Feb. 8, 2018

(65) Prior Publication Data
US 2019/0187569 A1   Jun. 20, 2019

(30) Foreign Application Priority Data

Aug. 5, 2016 (EP) .................................. 16183008

(51) Int. Cl.
*G03F 7/20* (2006.01)
*G06T 7/00* (2017.01)

(52) U.S. Cl.
CPC ...... *G03F 7/70525* (2013.01); *G03F 7/70625* (2013.01); *G03F 7/70633* (2013.01);
(Continued)

(58) Field of Classification Search
CPC ............. G03F 7/70525; G03F 7/70625; G03F 7/70633; G03F 7/70641
(Continued)

(56) References Cited

U.S. PATENT DOCUMENTS

| | | | |
|---|---|---|---|
| 6,915,177 B2* | 7/2005 | Phan | G03F 7/70525 257/E21.525 |
| 7,325,224 B2* | 1/2008 | Seltmann | G03F 7/70558 716/51 |

(Continued)

FOREIGN PATENT DOCUMENTS

WO    2015049087 A1    4/2015

OTHER PUBLICATIONS

International Search Report and Written Opinion issued in corresponding PCT Patent Application No. PCT/EP2017/067840, dated Oct. 30, 2017.

(Continued)

*Primary Examiner* — Hung Nguyen
(74) *Attorney, Agent, or Firm* — Pillsbury Winthrop Shaw Pittman LLP

(57) ABSTRACT

A diagnostic system implements a network including two or more sub-domains. Each sub-domain has diagnostic information extracted by analysis of object data, the object data representing one or more parameters measured in relation to a set of product units that have been subjected nominally to the same industrial process as one another. The network further has at least one probabilistic connection from a first variable in a first diagnostic sub-domain to a second variable in a second diagnostic sub-domain. Part of the second diagnostic information is thereby influenced probabilistically by knowledge within the first diagnostic information. Diagnostic information may include, for example, a spatial fingerprint observed in the object data, or inferred. The
(Continued)

network may include connections within sub-domains. The network may form a directed acyclic graph, and used for Bayesian inference operations.

20 Claims, 14 Drawing Sheets

(52) U.S. Cl.
CPC .......... *G03F 7/70641* (2013.01); *G06T 7/001* (2013.01); *G06T 2207/30148* (2013.01)

(58) Field of Classification Search
USPC .............................................. 355/52, 53, 55
See application file for complete search history.

(56) References Cited

U.S. PATENT DOCUMENTS

2004/0063009 A1   4/2004   Phan et al.
2012/0218533 A1   8/2012   Lyulina et al.
2015/0146188 A1   5/2015   Lyulina et al.

OTHER PUBLICATIONS

Taiwanese Office Action and Search Report issued in corresponding Taiwanese Patent Application No. 106126169, dated May 11, 2018.
Lam, Auguste, et al.: "Pattern recognition and data mining techniques to identify factors in wafer processing and control determining overlay error", Proc. of SPIE, vol. 9424, Mar. 19, 2015.
"Bayesian network", Wikipedia Jun. 13, 2016.
"Bayes' rule", Wikipedia May 3, 2016.
"Bayes' theorem", Wikipedia, Jun. 13, 2016.
"Probability theory", Wikipedia, May 3, 2016.
"Notation in probability and statistics", Wikipedia, Mary 3, 2016.
"Jeffreys prior", Wikipedia, Aug. 1, 2016.

* cited by examiner (a)

(b)

METHODS AND APPARATUS FOR OBTAINING DIAGNOSTIC INFORMATION, METHODS AND APPARATUS FOR CONTROLLING AN INDUSTRIAL PROCESS

CROSS-REFERENCE TO RELATED APPLICATIONS

This application is the U.S. national phase entry of PCT patent application no. PCT/EP2017/067840, which was filed on Jul. 14, 2017, which claims the benefit of priority of European patent application no. 16183008.8, which was filed on Aug. 5, 2016, and which is incorporated herein in its entirety by reference.

BACKGROUND

Field of the Invention

The invention relates to methods of obtaining diagnostic information relating to an industrial process. An example of an industrial process for which the method has been developed is a lithographic process, which includes one or more steps of transferring a pattern from a patterning device onto a substrate using a lithographic apparatus. The invention further relates to a diagnostic apparatus, to a device manufacturing method, to a controller for an industrial process and to a computer program products for causing a data processing apparatus to implement the methods and apparatus described.

Related Art

A lithographic process is one in which a lithographic apparatus applies a desired pattern onto a substrate, usually onto a target portion of the substrate, after which various processing chemical and/or physical processing steps work through the pattern to create functional features of a complex product. The accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable, however, and it remains important to trace and eliminate as many causes of such distortions as possible.

Modern lithographic processes and products are so complex that issues due to processing are difficult to trace back to the root cause. Overlay and alignment residuals typically show patterns over the wafer (of the process and/or lithographic apparatus itself). This may be interpreted as a non-correctable quantity with respect to a predefined model, while visual inspection and detailed analysis of the fingerprint may give an indication of causes and correction strategies. The spatial pattern in the fingerprint is not used to quantify the fingerprint, nor the observation that multiple causes may show up simultaneously in the apparent fingerprint. Overlay measurements are not generally available for each individual wafer, and the relation to the processing history and context is not generally known or used. Furthermore, it is difficult and time-consuming to make a list of all possible sources of spatial variation for the machine and process at hand.

Published patent application WO2015049087A1 (Ypma et al) proposes to provide automated support that addresses one or more of the problems with known techniques, identified above. The inventors in that patent application recognized that root cause finding, monitoring of wafer integrity and design of an appropriate correction strategy is conventionally a subjective and laborious exercise. Analysis of object data (e.g. alignment data) for a set of wafers was automated by defining a multidimensional space in which the object data for each wafer can be represented as a vector, and performing a multivariate analysis on the object data to obtain one or more component vectors in said multidimensional space. Diagnostic information about the industrial process is extracted using said component vectors. The component vectors can be used in combination with performance data and context data to perform automated or semi-automated root cause analysis. The diagnostic information can also be used to provide a performance monitoring system that can detect problems at an early stage, rather than only detecting them when some performance parameter exceeds permissible limits.

Nevertheless, operation of the diagnostic apparatuses of WO2015049087A1 relies on making manageable selection of the object data, performance data and context data to be used. The known apparatus can discover or suggest causal connections between context data (e.g. which tool has been used for a particular step) and observed fingerprints. The number of variables potentially to be considered as context data for root cause analysis is vast, and the designer of the diagnostic apparatus has to select those few variables that are both available and considered likely candidates for causing the behaviors of interest. To take them all into account would be impossible with a finite sample of a particular product run, and particular subsets of processing apparatus involved.

Consequently, the automated processing today remains confined to some specific sub-domain of the entire process, sometimes based on an underlying physical model, sometimes data-driven, and sometimes a combination of both. The (each) sub-domain is defined by skilled designers, based on their experience and expectation of related causes and effects. In effect, the result is a set of disconnected diagnostic sub-systems, each potentially automated using the techniques of WO2015049087A1 and/or other techniques, but each only "seeing" a part of the overall context. Each of these diagnostic sub-systems operates within its own sub-domain. For example, one diagnostic apparatus may be set up to analyze the effects of optical aberrations on a printed device pattern, while another one investigates wafer distortions. Similar fingerprints may in practice arise from such different causes, and each diagnostic apparatus will operate sub-optimally, because it is unaware of potentially relevant context.

Knowledge of the relationships between variables and process allows skilled operators to make some combination and comparison of results between these sub-domains, but this remains a highly subjective and human process. The potential to discover and/or exploit new knowledge or hypotheses about other potential causes, or relationships between causes, is severely limited. At the same time, subtle interactions between sub-systems become causes of significant error, as each recognized source of error are is eliminated and new, more demanding performance goals are set.

As is known, probabilistic networks and probabilistic inference methods (e.g. Bayesian inference) can be very successful in automating the discovery and exploitation of causal connections between variables in seemingly random data sets, or where knowledge of connections between variables is speculative and partial. Unfortunately, learning via a Bayes network or similar technique is unfeasible with such a large number of possible context variables is involved.

According to another aspect of the prior art, alignment systems for controlling overlay may be arranged to disregard or down-weight certain measurements of alignment marks and/or metrology targets, to reduce the influence of unreliable measurements. Such techniques are disclosed in prior published applications of Lyulina et al, such as US2012218533A1 and US2015146188A1.

US2012218533A1 discloses methods of correcting alignment using radial basis function (RBF) models, including a "relaxation" function for reducing susceptibility to outliers among the measured marks. US2015146188A1 discloses other methods for determining the usefulness of particular marks in alignment. Nevertheless these known techniques are limited in ability, to the extent that they are trying to judge what are outliers only from the measurements (object data) themselves. The contents of these publications are hereby incorporated by reference.

SUMMARY OF THE INVENTION

The invention aims to provide a practicable diagnostic system in which a wider range of context can be taken into account. The desired system will combine data in a sound, quantitative and reusable manner.

The invention in a first aspect provides a diagnostic system for use in relation to an industrial process, the system implementing a network comprising two or more sub-domains, wherein at least a first one of said sub-domains comprises first diagnostic information extracted by analysis of first object data, the first object data representing one or more first parameters measured in relation to a first set of product units that have been subjected nominally to the same industrial process as one another, wherein at least a second one of said sub-domains comprises second diagnostic information extracted by analysis of second object data, the second object data representing one or more second parameters measured in relation to a second set of product units that have been subjected nominally to the same industrial process as one another, and wherein said network further comprises at least one probabilistic connection from a first variable in the first sub-domain to a second variable in the second sub-domain, part of the second diagnostic information thereby being influenced probabilistically by knowledge within the first diagnostic information.

The invention further provides a method of obtaining diagnostic information relating to an industrial process, the method comprising:

implementing a first sub-domain comprising first diagnostic information extracted by analysis of first object data, the first object data representing one or more first parameters measured in relation to a first set of product units that have been subjected nominally to the same industrial process as one another;

implementing a second sub-domain comprising second diagnostic information extracted by analysis of second object data, the second object data representing one or more second parameters measured in relation to a second set of product units that have been subjected nominally to the same industrial process as one another;

implementing a network comprising at least one probabilistic connection from a first variable in the first diagnostic sub-domain to a second variable in the second diagnostic sub-domain, whereby the second diagnostic information is influenced probabilistically by knowledge within the first diagnostic information.

In certain embodiments of the invention, the network comprises a directed acyclic graph. The network may include one or more further probabilistic connections between variables within the first and/or within second sub-domain. The diagnostic may be arranged to perform one or more Bayesian inference steps using the network so that a variable within the first sub-domain is influenced by propagation of belief from within the second sub-domain.

In some examples, one or more of the variables represents a spatial fingerprint observed in the object data. Such a spatial fingerprint may be derived for example by performing a multivariate analysis on the first object data, in the manner described in the prior published patent application by Ypma et al, mentioned above.

In some examples, said object data includes spatially distributed measurements of one or more of overlay, critical dimension, side wall angle, wafer quality, focus.

The invention in a second aspect provides a diagnostic system for an industrial process, the diagnostic system comprising:

a first sub-domain comprising first diagnostic information associating probabilistic first context data to a first product unit based on one or more first parameters measured in relation to the first product unit; and a second sub-domain distinct from the first diagnostic sub-domain, the second diagnostic sub-domain comprising second diagnostic information associating probabilistic second context data to a second product unit based on one or more second parameters measured in relation to the second product unit, wherein the diagnostics system further comprises an interface between the first diagnostic sub-domain and the second diagnostic sub-domain configured to implement a probabilistic connection between the first context data and the second product unit.

the invention in the second aspect further provides a diagnostic method for an industrial process, the method comprising:

implementing a first sub-domain comprising first diagnostic information associating probabilistic first context data to a first product unit based on one or more first parameters measured in relation to the first product unit;

implementing a second sub-domain distinct from the first diagnostic sub-domain, the second diagnostic sub-domain comprising second diagnostic information associating probabilistic second context data to a second product unit based on one or more second parameters measured in relation to the second product unit; and implementing a probabilistic connection between the first context data and the second product unit.

The invention further provides a method of controlling a lithographic apparatus wherein corrections are applied based on diagnostic information extracted from object data using a diagnostic system and/or a diagnostic method according to the either of the first aspect and the second aspect of the invention, as set forth above.

The invention yet further provides a controller for a lithographic apparatus, the controller including a diagnostic system according to either or both of the first aspect and the second aspect of the invention, as set forth above, the controller being arranged to use diagnostic information extracted from object data using the diagnostic system to apply corrections in the applying a pattern to a substrate.

The invention yet further provides a method of controlling an industrial process in which product units are subjected to one or more processing operations, the method comprising the steps of:

measuring a plurality of product units that have been subjected to some or all of said processing operations to obtain object data representing for each product unit one or more parameters measured on the product unit at points spatially distributed across the product unit;

using said object data to obtain diagnostic information using a diagnostic system and/or a diagnostic method according to either or both of the first aspect and the second aspect of the invention, as set forth above; and controlling the performance of said industrial process for subsequent product units based on the extracted diagnostic information.

The invention further provides a computer program product comprising machine readable instructions for causing a general purpose data processing apparatus to implement a diagnostic system and/or a diagnostic method according to either or both of the first aspect and the second aspect of the invention, as set forth above.

The invention further provides a computer program product comprising machine readable instructions for causing a general purpose data processing apparatus to perform the steps of a method of controlling an industrial process according to the invention as set forth above.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Industrial Process Example

Before describing embodiments of the invention in detail, it is instructive to present an example environment in which embodiments of the present invention may be implemented. The example is a manufacturing facility for semiconductor products, implementing one or more lithographic manufacturing processes. It will be understood that the present disclosure is not limited to this type of industrial process, and call be applied in other types of industrial process.

Figure 1:
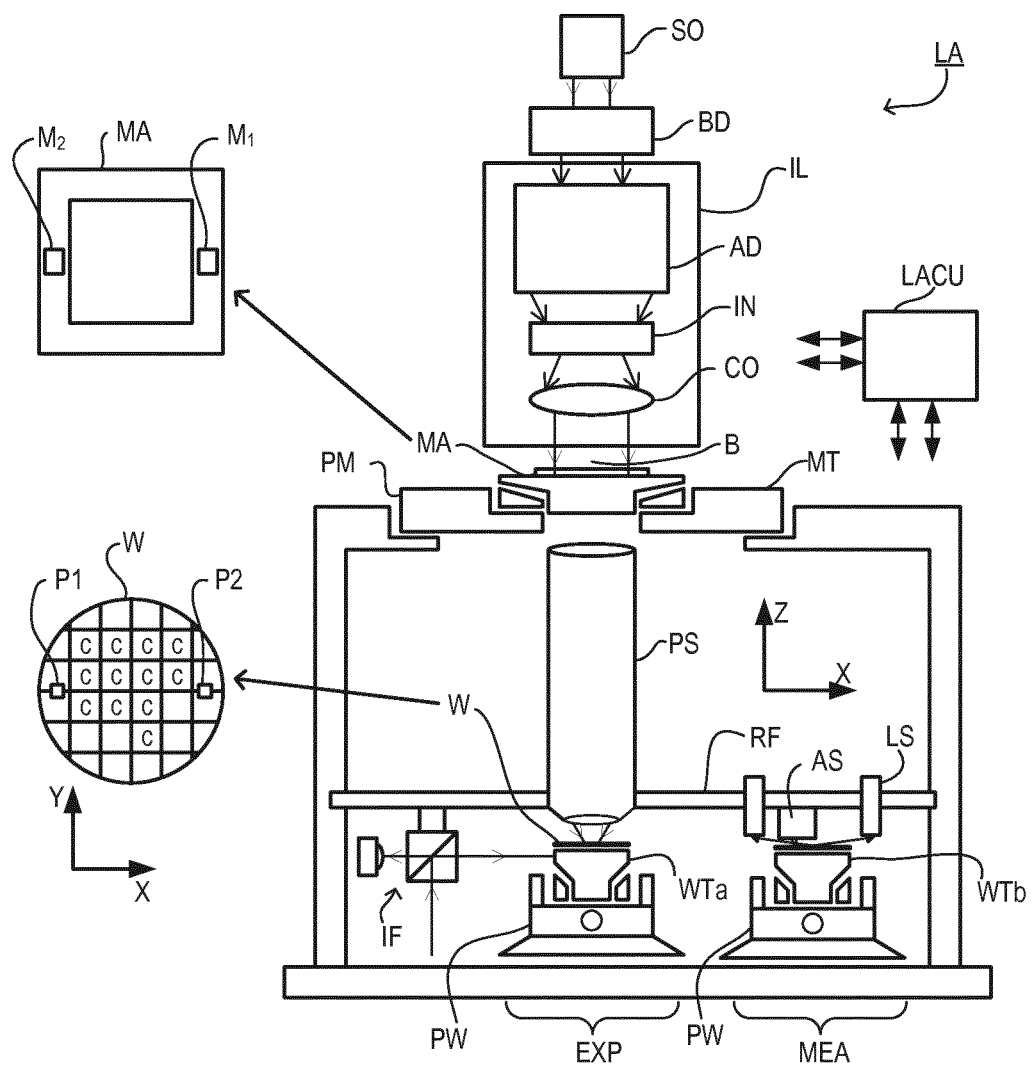
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
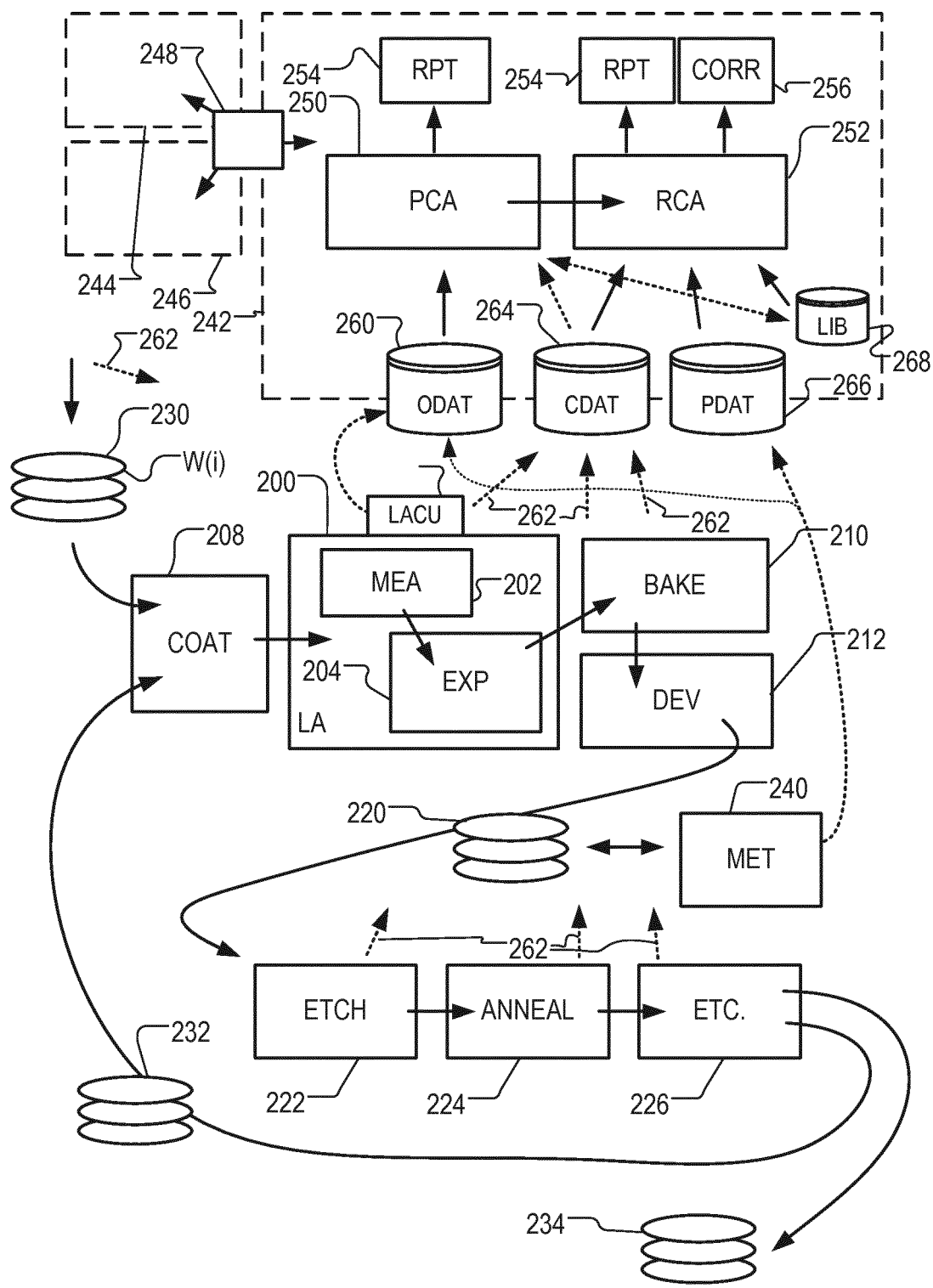
FIG. 2 shows schematically the use of the lithographic apparatus of FIG. 1 together with other apparatuses forming a production facility for semiconductor devices, the facility including diagnostic apparatuses operating in one of several diagnostic sub-domains within a diagnostic system according to embodiments of the present invention.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps are implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

Also shown in FIG. 2 is a metrology apparatus 240 which is provided for making measurements of parameters of the products at desired stages in the manufacturing process. A common example of a metrology station in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results from the apparatus 240 can be used for quality control. They can also be used as inputs for a process monitoring system. This system can be used to maintain accurate performance of the patterning operations in the litho cluster, by making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Diagnostic System Background

In order to provide tools for use in analyzing the sources of poor performance in the lithographic manufacturing process, the industrial production facility of FIG. 2 includes a variety of diagnostic sub-systems 242, 244, 246. Internal structure of one of these sub-systems, 242, is shown schematically and will be described below, while the other sub-systems are shown in outline only. The structure within sub-system 242 is presented only as one example of a possible structure, based on the disclosure of WO2015049087A1 (Ypma et al), mentioned above. Similar tools in another form can be used to improve performance of the process monitoring system, as is also described in WO2015049087A1. The structure within different sub-systems can vary. For convenience it can be assumed that they are all the same, operating in a similar fashion on the variables and data of a particular sub-domain.

In accordance with principles of the present disclosure, a probabilistic network 248 connects parts of the different sub-systems, which otherwise would operate independently of one another. The structure and operation of one diagnostic sub-system will be described first.

Within the example diagnostic sub-system 242 there is a first diagnostic apparatus 250 and a second diagnostic apparatus 252, as illustrated at the top of FIG. 2. Each diagnostic apparatus 250, 252 is implemented by a combination of computer hardware and software, connected to receive data from the manufacturing facility just described. The computer hardware can be located in the same facility as the litho tool and other apparatus, or it can be located remotely and connected by telecommunications channels and/or removable storage. As will be explained, apparatus 250 and 252 can produce, for example, a report 254 identifying a likely cause, or a list of potential causes, for an identified error. It may produce ready-made corrections 256, which can be applied to the control systems of one or more of the apparatuses 200-226, to improve the performance of the system in processing product units in future. Corrections may be associated with context criteria indicating that they should be applied selectively to product units, depending on their individual processing history.

The first diagnostic apparatus 250 in this example is designed to perform multivariate analysis, for example principal component analysis (PCA), to identify a number of component vectors contributing to deviations measured from the products themselves (substrates in this case). Different forms of multivariate analysis may be used, and PCA analysis is referred to herein purely as one example. In the specific example case of PCA, the identified component vectors are eigenvectors of a covariance matrix of the measurement data. The component vectors are orthogonal in the multidimensional space. In another method, called Independent Component Analysis (ICA), projections of the measurement data onto the component vectors are as independent as possible. The ICA technique leaves all second and higher order cross-correlations at zero, while the orthogonality of the PCA technique forces second order cross-correlations to be zero but may leave non-zero higher order cross-correlations. Apparatus 250 will be referred to hereinafter as the PCA apparatus for convenience, without intending any limitation.

Diagnostic sub-system 242 in this example is predominantly data-driven. Input for PCA apparatus 250 is object data, that is, data measured in relation to each product unit. This data may be measured on the product units themselves, or on parts of the apparatus or other materials involved in the processing of the product units. In the context of a lithographic apparatus, measurements may be taken on the substrate support WTa/WTb, or on elements of the projection system PS, the illumination system IL and so forth. Measurements can be taken on the patterning device (reticle) MA and/or its support MT.

In the particular sub-system 242 illustrated and described herein, the object data, stored in a database 260, comprises in particular the alignment data conventionally obtained by the lithographic apparatus 200 using the alignment sensors AS in the measurement station 202. As this data representing detailed measurements of positions of marks in the X-Y plane of the substrate is obtained inherently as part of the normal patterning operation, little or no penalty is incurred by instructing the control unit 206 to store the data in the object data storage 260. In other embodiments, and in other sub-systems within the same embodiment of a diagnostic system, the object data may be measured elsewhere in the system, in addition to or instead of the alignment data measured by the litho tool 200. Alternatively or in addition to the alignment data, the object data may include height data obtained using level sensor LS, "wafer quality" signals from the alignment sensors AS and the like. The object data in storage 260 may also be obtained from other measurement apparatus, for example the metrology apparatus 240. In this way, the object data can include measurements directly or indirectly of performance parameters such as overlay, CD, side wall angle, wafer quality, mark asymmetry, leveling and focus. Further below, an embodiment will be described in which such object data can be used and analyzed to implement an improved process monitoring system in the manufacturing facility of FIG. 2. It is also possible that these parameters can be measured by apparatus within the litho tool 200 itself. Various prior publications describe special marks and/or or measurement techniques for this. For example information on mark asymmetry can be obtained using signals obtained at different wavelengths by the alignment sensors.

The second diagnostic apparatus 252 is for performing root cause analysis (RCA), for establishing correlation between component vectors identified by the PCA apparatus and performance and/or context data associated with individual substrates. This RCA apparatus 252 is arranged to receive the results of the multivariate analysis from PCA apparatus 250. RCA apparatus 252 then correlates the observed component vectors based on the object data alone, with one or more items of what we shall call context data and performance data. This context data may also be regarded as "history" data, as it is data not obtained from the products themselves but representing all or part of the processing history of individual product units (substrates), or batches of product units. Arrows 262 throughout the diagram illustrate how context data may come from any of the apparatuses. Context data may also arrive with the new substrates 230. For example, the context data may record what types of process steps have been applied previously to a substrate, which individual apparatuses have been used in the performance of those steps, and what parameters were applied by those apparatuses (for example settings of temperature or pressure case while in etching apparatus 222, or parameters such as illumination modes, alignment recipes, etc. in the litho tool 200). The context data is stored in storage 264 for use by the RCA apparatus 252.

RCA apparatus 252 further has access to performance data, which may include for example measurements of overlay or CD, and which is stored in storage 266. While FIG. 2 shows separate storage 260, 264, 266 for each of the object data, context data and performance data, it will be appreciated that these different types of data may be stored in one common storage unit, or may be distributed over a larger number of storage units, from which particular items of data can be retrieved when required. Further, whilst the context data 262 is shown as emanating from each individual apparatus 222, 224, etc. the data may be collected through a central control system that controls the operation of the manufacturing plant as a whole.

Each record in the object data storage is labeled with a unique identifier. Noting that an individual wafer might pass repeatedly through the same litho tool in the course of a manufacturing process, or might pass through different tools all measuring the same marks, it is possible to collect object data for the same product unit at different stages of the manufacturing process. Each of these instances of measurement can be treated in the analysis as an independent product unit. In the case where there are multiple instances of the same wafer being measured at different stages in a complex manufacturing process, however, the object data will include an identifier that uniquely identifies not only the individual wafer, but the stage of processing in which it has been measured. Typically in a lithographic process, different instances of the same wafer will be associated with patterning successive layers of a device structure. Knowledge of the relationship between these instances in the object data can be used as context data for diagnostic purposes in the RCA apparatus 252.

For operation of the probabilistic network 248, wafer identifiers used in the different sub-systems 242, 244, 246 may be the same, or may be translated by look-up tables.

As the multivariate analysis in first diagnostic apparatus 250 can be performed independently of the context data, that apparatus can operate independently of the availability of any particular form or completeness of context data. However, context data can also be used by the first diagnostic apparatus if desired, for example to select certain subsets of the product units for inclusion in the data for multivariate analysis, rather than differentiating between product units only when the results of the multivariate analysis are displayed. As examples, so-called "chuck-to-chuck" comparisons can be important in a case where the litho tool has more than one "chuck" or substrate table (WTa, WTb in FIG. 1). When it has access to this part of the context data, the PCA apparatus 250 can select and analyze separately the product units that have been processed on the different chucks. The multivariate analysis may be performed so as to discriminate between subsets of product units without treating them entirely separately. Methods such as the one known as "mixtures of PCA" allow the analysis to be performed with regard to certain clusters within the object data, without explicitly separating their datasets. Instead, the different analyses per cluster are weighted with the likelihood that a certain vector (corresponding to a certain measured product unit) falls within a certain cluster.

As explained in the prior patent application, the multivariate analysis can be performed in a manner that discriminates between subsets of vectors at least partially by reference to context data. The context data may identify a particular apparatus or part of an apparatus involved in processing the product units, as in chuck-to-chuck comparison. The context data may a stage (step) in the industrial process at which the measurements represented in the vectors were obtained, as for example in layer-to-layer comparison.

Storage 268 is provided for library data which can be used for recognizing patterns in the results of the multivariate analysis. In particular, it has been mentioned already that certain fingerprint types can be recognized by experts familiar with the process, and this recognition brings with it certain knowledge of likely causes and effects. The library data can store a collection of reference vectors that can be matched with vectors identified from the object data. Once a reference vector has been matched, further information stored in association with it can be retrieved from storage and used to guide the further operation of PCA apparatus 250 and/or RCA apparatus 252. For example, the data stored with a "swirl" fingerprint in the library might comprise the name label "swirl" and hints to look for correlation between this fingerprint and annealing operations in the context data for the affected product units.

As explained above, the diagnostic methods and apparatus disclosed herein may employ object data that is data measured from points distributed spatially over each product unit. In the example of a lithographic production facility where the product units are semiconductor substrates (wafers), a particularly interesting source of comprehensive object data is the set of measurements performed in the litho tool to characterize each wafer and the patterns previously deposited upon it. These measurements are used to obtain parameters for alignment models, that are used in a new patterning step to control accurately the positioning of patterns applied in relation to features already present.

Diagnostic Sub-System Operation

Figure 3:
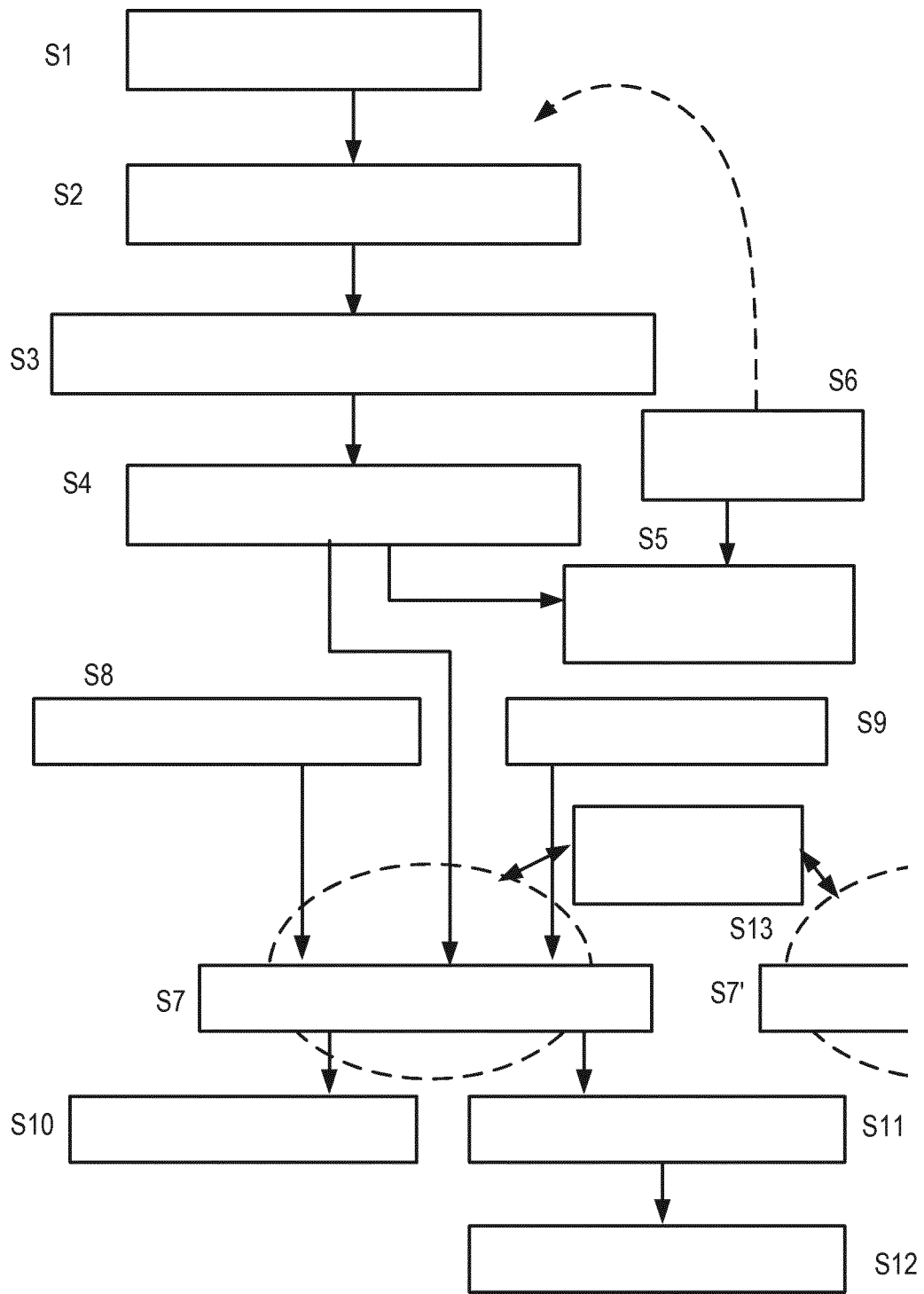
FIG. 3 is a flow chart summarizing steps in the operation of first and second diagnostic apparatus in a sub-system of a diagnostic system according to an embodiment of the invention.

FIG. 3 summarizes in flowchart form the operations performed by PCA apparatus 250 and RCA apparatus 252 in the example embodiment. More detailed embodiments of the PCA apparatus and the RCA apparatus are described in the prior published application WO2015049087A1. The contents of that prior publication are incorporated herein by reference. The present disclosure is in no way limited to these particular types of diagnostic apparatus.

In a step S1, object data for a population of product units (in the example, semiconductor product wafers) is obtained and compiled in a covariance matrix at step S2. At S3 the covariance matrix is processed by multivariate analysis. As described already above, the effect of the multivariate analysis is to decompose the distribution of all the vectors in the object data into a set of component vectors, for example component vectors. In step S4 the set of component vectors is processed together with identification of the different product units, to analyze the distribution in desired ways. Results may be processed and selected for display partly by automatic operation and partly by human operator interaction.

The results of the analysis are optionally used in step S5 to provide automatic excursion detection as production continues. New object data from each product unit or batch (lot) of product units is received at S6 and compared with the distribution in one more of the component vector dimensions to detect product units lying outside the main distribution (outliers). Optionally, the new object data can be added to the covariance matrix and used to update the decomposition into component vectors. More detail of these functions can be found in the published patent application.

Figure 12:
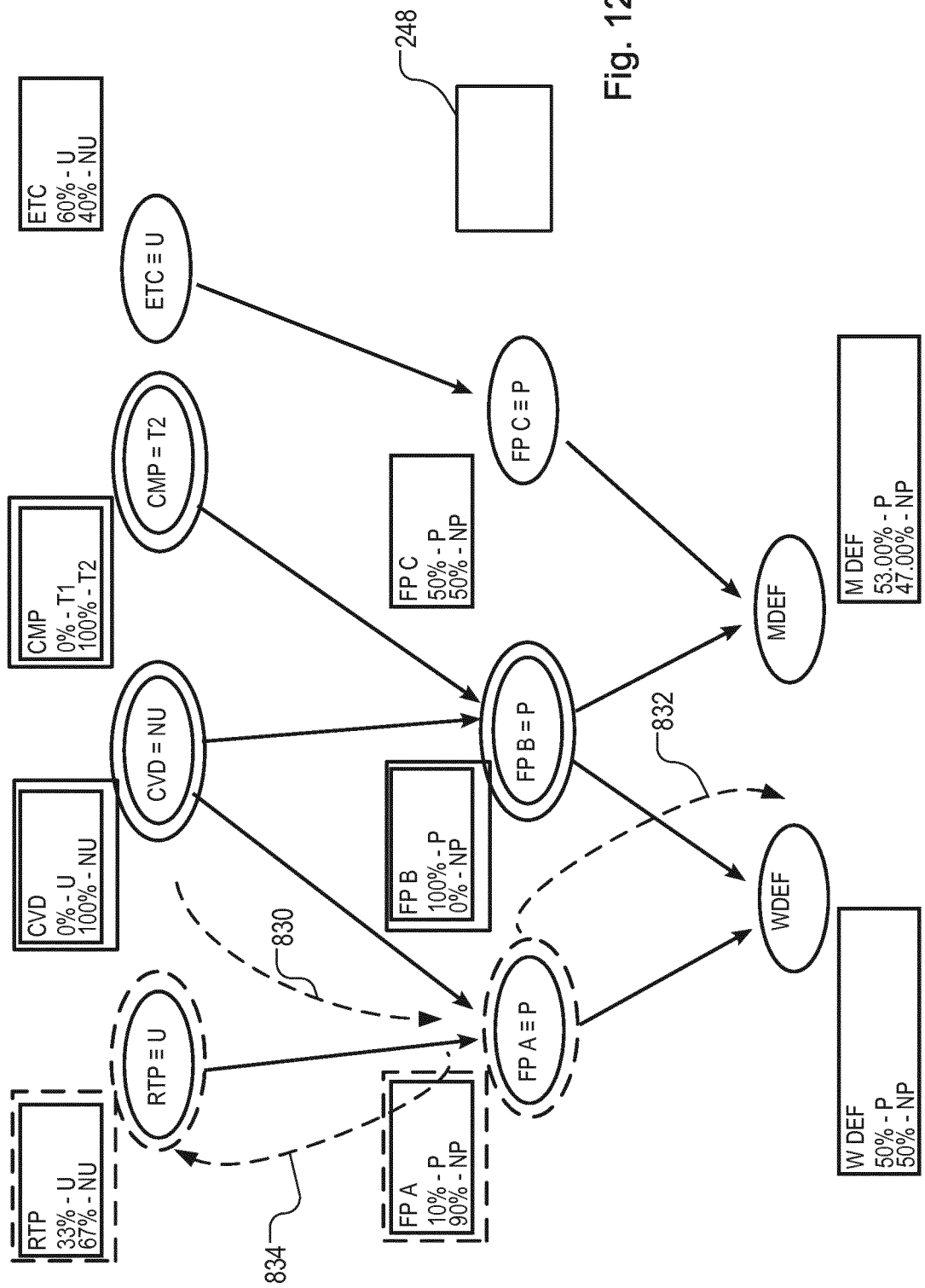

At step S7 in FIG. 12, root cause analysis is performed in RCA apparatus 252. This apparatus combines the results of the decomposition into component vectors with performance data obtained in step S8 and/or context data obtained in step S9. The results of the root cause analysis may be displayed or reported at step S10, or they may be used to generate corrections to process control settings at step S11. At step S12, production continues for new product units (for example semiconductor product wafers), applying the corrections to improve the produced products by reducing one or more of the identified fingerprints.

Not all identified fingerprints can or should be corrected. Defining a fingerprint correction may be regarded as a permanent solution to the issues revealed by the analysis, or it may be that servicing or replacement of a responsible apparatus is required. Correction may be useful as a temporary measure until the responsible processing apparatus can be recalibrated or repaired. If the error is not correctable sufficiently, the apparatus in question may be omitted from processing (or reassigned to less critical operations). In addition, it should be noted that to correct some fingerprints might make a performance parameter such as overlay worse, not better. This is because a fingerprint that remains consistent from layer to layer introduces no overlay error at all, whereas to identify such a fingerprint and attempt to correct it in subsequent layers would introduce overlay. Identification of fingerprints that should not be corrected can be stored and exploited by removing this component vector when calculating the corrections for each product unit.

Furthermore, fingerprints that should be corrected may be present only in some of the product units. Where PCA apparatus 250 and/or RCA apparatus 252 has been used to identify the context in which certain fingerprints arise, corrections may be generated with associated context criteria, so that they may be applied selectively in the processing of further product units, depending on the processing history of those particular product units. Thus, corrections may be applied to a product unit only when the processing history of that unit matches the context criteria associated with that correction. It will be understood that, in a lithographic process, corrections will often be selected and applied on a batch or lot basis, rather than for each individual wafer. Furthermore, it will be understood that corrections may be applied in the lithographic operation, that are designed to correct fingerprints arising from the physical and/or chemical operations to which product units have been subjected. Context criteria can be defined in terms of the information extracted from the results of the multivariate analysis, rather than explicit context data.

Without needing to know in advance what parameters will be of interest, collection of alignment data and/or other object data can be performed in the background of the normal manufacturing process. If possible, process context data and other identifying data can be gathered. Some of this data can be collected in an anonymized form, so that confidentiality of a process can be respected, while outsourcing the analysis. Within the overall form of the embodiment described, a number of "use cases" can be envisaged for the new apparatus. Example functions for a commercial embodiment include: a "one button push" to show fingerprints (the top 10, say) plus mean fingerprint ("PC0"); automatic suggestion of labels for component vectors or clusters of component vectors (e.g. using data scatter); automatic estimation of the performance impact (for example in nanometers of overlay) of a particular component vector or group of component vectors. A qualitative assessment of overlay impact of a certain alignment component vector can be made from alignment-overlay (performance data) correlation analysis, even if detailed simulations sufficient for a quantitative calculation are not undertaken. More detailed examples of the RCA apparatus are described in the prior published application WO2015049087A1, incorporated herein by reference.

The user interface can provide for an operator to ask for 'relevant fingerprints' and will report a short list of outlier wafers and lots, and processing tools co-occurring with such outlying wafers and lots. The user interface 1200 and visualizer 1202 can visualize alignment deltas of various types (see WO2015049087A1 FIGS. 16 and 17); (color-to-color, step-to-step (layer-to-layer)). It can visualize scatter of the dataset, allow for automatic clustering and visualization of a "mean wafer" (average wafer) per cluster. The co-occurrence of tools and fingerprints can be exploited automatically for example by a Bayesian network or by deriving sets of co-occurrence patterns representing frequently occurring processing tool sets. According to the present disclosure, as explained further below, the concepts of the Bayesian network will be applied not only within a confined sub-domain but for combining sub-domain models within a larger reasoning framework. If performance data such as overlay is also available, the apparatus can correlate this with the component vectors observed in the object data (FIG. 15 in WO2015049087A1).

In another category of uses, instead of the step S11 of generating corrections as normally understood, the apparatus can generate other data (recipes) for controlling or advising on some aspect of subsequent processing. In a particular example, an "Alignment advisor" can be made, which suggests better operation of the alignment sensors themselves (see discussion of FIG. 17 in WO2015049087A1.) A "library" of fingerprints can be accumulated in the storage 268, by which recipes suitable for a particular situation can be retrieved upon observation of fingerprints similar to those observed before.

Further variations and applications include: analysis of overlay as object data, color-to-color analysis of alignment data; observation of intra-field fingerprints rather than (only) the inter-field fingerprints illustrated herein; improved "flyer removal".

With regard to color-to-color analysis, for example, it may be noted that alignment sensors AS will typically illuminate the alignment targets with a range of different wavelengths of radiation (colors), to improve the chance of a good position reading through overlying layers. Often an alignment "recipe" will simply select a single "best" color to use to read marks in a given situation, and other data is discarded. Comparison between signals obtained with different colors can however reveal interesting diagnostic information. In particular, color-to-color differences can indicate the presence of mark asymmetry, where structures within a mark have become distorted by processing. Corrections for subsequent processing steps can then be generated differently, depending whether it is judged that a fingerprint represented apparent deviations caused by mark deformation and the measurement process, rather than actual positional deviations of the marks.

Flyer removal refers to the identification of individual marks that are outliers relative to the other marks on the same wafer. The occurrence of such "flyers" can be due to a variety of local factors, which can be easier to recognize using the identified component vectors.

Root Cause Analysis within Sub-Domains

Expanding now on RCA apparatus 252 and step S5 in the flowchart of FIG. 12, various techniques are available to the operator of the system, for performing analysis to identify the root cause of the fingerprints (component vectors) present in the analyzed product units. Referring back to FIG. 5, it will be recalled that certain fingerprints are recognizably associated with certain processing steps. Thus, if a "swirl" fingerprint PC1 emerges as a contributor in a number of the wafers (and not in others), annealing processes and apparatuses become suspect as causes of the fingerprint. This is the situation illustrated in FIG. 4. Similarly, if a "scaling" fingerprint PC2 is observed to be strong in a number of the wafers, it may be suspected that positional deviations are partly the result of physical distortions introduced by an etch step. In each case, as illustrated, statistical calculations based for example on Gaussian distributions and sigma (standard deviation) values can be employed to distinguish "outlier" wafers 1100 having a lot of swirl from "normal" wafers 1102, and to distinguish outlier wafers 1110 having a strong scaling fingerprint from normal wafers 1112. Note that, although some wafers have a strong positive coefficient and others have a strong negative coefficient, these are both indicative of a strongly expressed fingerprint, only with a different sign. The apparatus in this example will group both positive and negative outliers together as equals. The apparatus can offer a function to group positive and negative outliers separately, if desired.

If the product units in question have reached such a stage in their history that they have undergone several annealing steps and other processing steps, potentially in different apparatuses, the reason why some of them have stronger fingerprints than others may be hard to determine without automated assistance.

Figure 4:
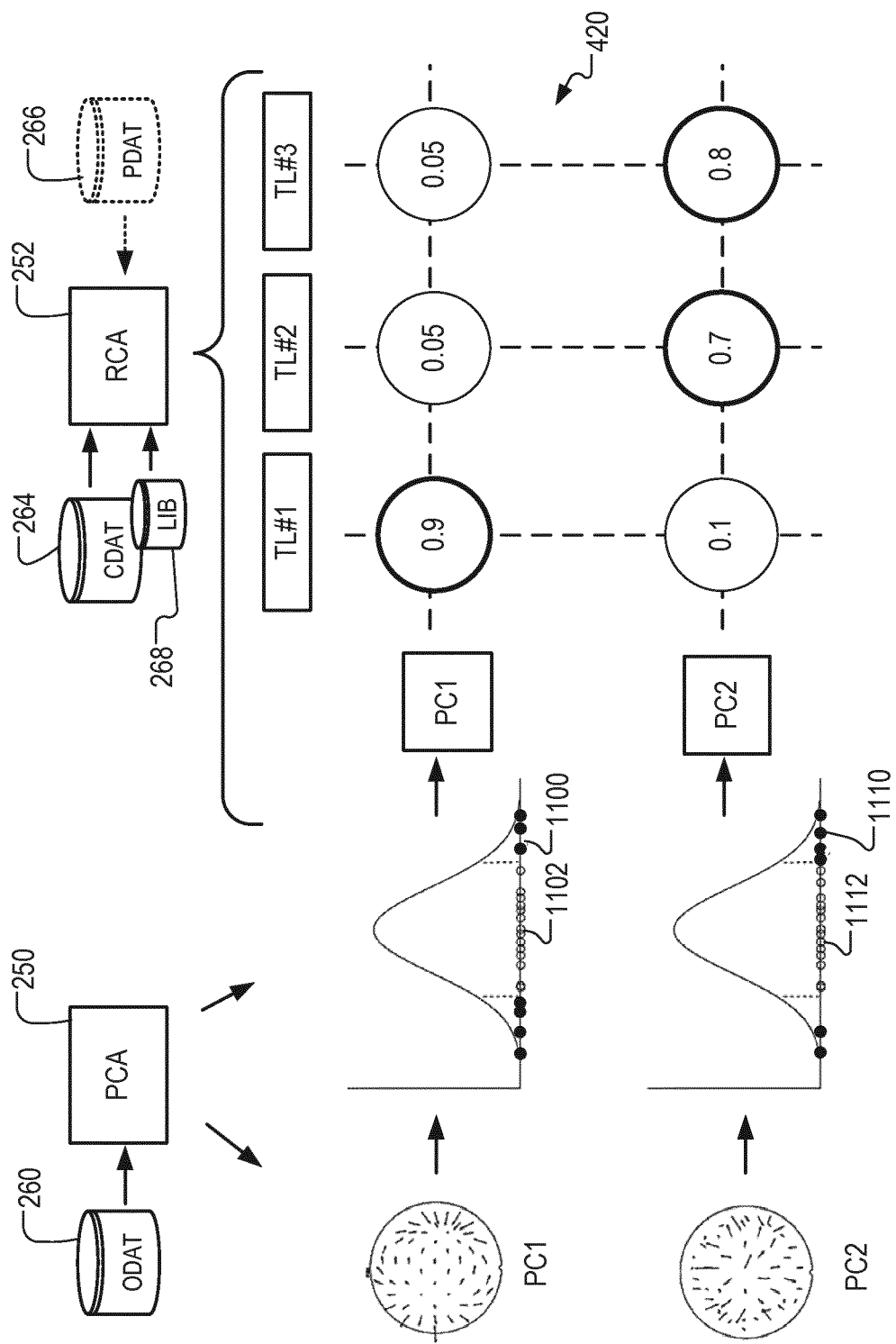
FIG. 4 illustrates schematically various modes of operation of the second diagnostic apparatus that may be used independently or in combination for performing root cause analysis in an embodiment of the invention.

As shown in FIG. 4, RCA apparatus 252 in one embodiment uses the determined component vectors (fingerprints) in combination with context data from storage 264 to identify correlations between the strength of the identified fingerprints and certain events, apparatuses, or parameters in the history of the product units represented in the object data. Analysis is performed to identify correlations between (i) the context data 264 representing history of the product units and (ii) the positions of those product units in the multidimensional space represented by the component vectors that have emerged from multivariate analysis of the object data 260. There are many forms this analysis may take, so that RCA apparatus in practice can offer a suite of functions, to be used according to the task at hand. In addition to context data, performance data 266 can be used to find correlations between certain performance parameters (CD, overlay) measured from the product units and the component vectors identified in the multivariate analysis.

In the illustrated example, a network 420 of co-occurrence relations is established between the occurrence of certain processing apparatus (tools) TL#1, TL#2 and TL#3 in the history of a wafer and the fingerprints PC1 and PC2 in the object data. These three apparatuses may be nominally identical and should perform identically, but the investigation will reveal if one or more of them are causing unwanted effects in practice. In principle, the analysis can be performed "blindly" to seek correlation between any of the identified fingerprints and any or all of the events and apparatuses in the histories of the product units, and for all parameters of the context data. Alternatively, as in the illustrated example, some human or machine expertise can be applied to identify that the observed fingerprints are characteristic of etch and anneal steps, and to seek correlations between the occurrence of the fingerprints and the use of certain tools or tool clusters that may have been used to perform those particular steps. In the illustrated example, the analysis reports co-occurrence analysis values representing the percentage of wafers having each tool in their history that display the fingerprint strongly. This report reveals that among the three tools, 40% (fraction 0.4) of the wafers that have at some point in their history been processed using tool TL#1 have a strong fingerprint PC1 (large coefficient c(PC1)), while the corresponding percentages for tools Tl#2 and TL#3 are only 5%.

Thus, tool TL#1 is strongly implicated as a cause of poor performance in the production process. This can trigger further investigation and/or recalibration of the implicated tool. It may also trigger the generation of a history-dependent correction (FIG. 3 step S11). This correction is an addition to the alignment model that can be applied automatically in subsequent lithographic patterning steps, whenever context data indicates the use of that particular tool or tools in the history of the wafers being processed. Noting that several tools are associated with the same fingerprint PCX, it will also be appreciated that the fingerprints actually added to each wafer by the implicated tools may differ slightly from one another. The fingerprint PCX is however useful as an approximation to those individual fingerprints.

Searching through the other component vectors may reveal minor fingerprints and hence more specific corrections that can be assigned to each specific tool, if such accuracy is deemed necessary. In either case, each correction is stored in association with context criteria so that context data for wafers in subsequent steps can be used to determine whether that correction should be applied. Processing of subsequent wafers can therefore be improved, irrespective of whether those wafers have been included in the analysis.

On the other hand, in relation to wafers that are outliers in the distribution of component vector PC2, tool TL#1 is only weakly implicated (co-occurrence analysis value 10%), while tools TL#2 and TL#3 both have higher co-occurrence analysis values (20%, 20%). It will be understood that these results are not conclusive of a fault in a certain tool. Further investigation will generally be required, for example to identify what other factors in the context data can explain why 20% of the wafers processed by tool TL#2 have a strong fingerprint PC2, but 80% do not. Factors outside the sub-domain represented by the chosen context variables may be involved. The techniques disclosed herein allow knowledge and/or learning from other domains to be used to improve the identification of these factors, as will be described further below. The findings may trigger a correction to be generated, either automatically or with user interaction, as described above with reference to step S11 in FIG. 3.

In the illustrated example, the context data of interest is categorical in nature, and signifies whether a certain processing apparatus (etcher, deposition chamber etc.) set of tools was involved in the history of processing each wafer. By "categorical" we mean that a given feature or event was either present (one or more times) in the history of a product unit, or was not. Other context data, such as a parameter indicating what temperature setting was used in a particular process step or what strength of correction was applied in a process correction in the litho tool, can be continuous in nature. When it comes to performance data 266, this also can be categorical or continuous in nature. Continuous data can be turned into categorical data if desired. For example, overlay data may be continuous in nature, but wafers can be categorized for example according to which are outliers in the distribution of overlay values and which are not, or which wafers fall outside some absolute performance specification. The component vectors PC1 etc. can also be treated as continuous variables, or they may be categorized, as in the illustrated example.

Where the context data or performance data is categorical, co-occurrence relations can be sought in the manner described above by discovering frequently co-occurring sets of categorical items (i.e. tools and outliers). One particular implementation of the co-occurrence relation discovery concerns a particular pre-processing of the available data and a particular type of co-occurrence pattern to be found.

In this scenario, a single database $\mathcal{D}$ is constructed that joins both object data and context data (and/or performance data) for each product unit. Given that the projection of the object data of each product unit is continuous, it is first discretized in order for it to be useful for discovering the considered co-occurrence patterns.

A possible method to discretize the projections is to determine whether each product unit constitutes an outlier with respect to one or more fingerprints, given the distribution of the projections of all product units. This leads to a binary version of the projected object data, stating whether or not this product unit is an outlier given the underlying distributions.

Each row in the resulting database $\mathcal{D}$ consists of the product units' outlier indications of the object data projections, and their associated context data (and/or performance data). A co-occurring pattern c can be defined as a subset of the possible variables in $\mathcal{D}$, and their particular instantiations (e.g. PCA_1=outlier, and Tool_1=Etcher_A).

Each pattern c can be considered as a local model that describes a specific part of $\mathcal{D}$. By selecting a set of patterns c, denoted by $\mathcal{C}$, a model for the complete database $\mathcal{D}$ can be constructed. The choice of model $\mathcal{C}$ depends on a chosen optimization criterion. One instantiation of this criterion is to consider an encoding scheme that assigns each encoder $\mathcal{C}$ a particular encoded database length. In this setting, the best encoder is the optimal model.

An optimal co-occurrence pattern set $\mathcal{C}$ contains significant (given the chosen optimization criterion) relations between variables in $\mathcal{D}$ (discretized object data, context data, and/or performance data). This set $\mathcal{C}$ can be used to make the relation between tools and component vectors apparent.

A probabilistic analysis, for example using a Bayesian network, can be used whether the context data is either categorical or continuous or discrete. In this approach, a network is constructed which represents via 'network parameters' θ the joint probability that a component vector outlier occurs when a certain processing tool is used. An initial choice for the joint probabilities may be specified by a skilled engineer, or by studying tool-fingerprint occurrences from historic datasets. This initialization specifies a 'prior probability' on tool-fingerprint co-occurrence as a 'prior' on the network parameters p(θ). In a Bayesian network, observations on occurrence of fingerprints and/or involvement of processing tools from new product units can be entered as 'evidence' (data) D in the network. The likelihood p(D|θ) of the observations given the current network parameters is computed and combined with the prior p(θ) into a posterior probability p(θ|D) on the network parameters given the data. This can be done using Bayes' rule of inference:

$$p(\theta|D) = \frac{p(D|\theta) \cdot p(\theta)}{p(D)}$$

Postulation of conditional dependencies between variables (occurrence of certain tools and fingerprints) may be used to make computation of posterior parameter probabilities ('Bayesian inference') tractable, or one may rely on computing the parameter setting θ* that maximizes the a posteriori probability, $$\theta^*_{MAP} = \mathrm{argmax}_\theta P(\theta|D).$$

In the case where a flat prior is assumed (i.e. without prior knowledge on the probability of joint tool-fingerprint occurrence), this last expression reduces to the maximum likelihood estimate:

$$\theta^*_{ML} = \mathrm{argmax}_\theta P(D|\theta).$$

By this mechanism, spatial measurement data and/or context data from newly incoming product units can be used to update the probability of co-occurrence for the particular use case and fully customize the local model when sufficient data arrives. Note that observation of either spatial measurement data or context data (or both) for new product units is allowed, since probabilities on any of the missing (non-observed) variables may be inferred via aforementioned Bayes' rule of inference.

The results of the probabilistic analysis can be used to make inferences about causes and effects. The type and complexity of the analysis is a matter of design choice. The methods described above are only examples. From experimental use of the present apparatus, for example, instances have been observed where the presence of a fingerprint of interest is correlated most strongly not with the occurrence of any one apparatus or processing operation alone, but with the occurrence of a particular sequence of operations or apparatuses. The RCA apparatus can therefore provide functions for identifying such sequences as a parameter in the context data.

As discussed in the published application WO2015049087A1, other modes of operation of RCA apparatus 252 are possible. In some of these, for example, graphic visualization is used to allow correlations to be observed by a human operator.

Challenges in Extending from Local Models

Complexity becomes an increasing challenge in root cause analysis. As each source of major error is identified and corrected, performance improvement depends on identifying and correcting ever smaller sources of error. More and more we see previously unknown combinations (interactions) of different effects that affect performance parameters like overlay on the finished products. As a first example, combinations of different processing tools lead to wafer fingerprints due to wafer warpage. The resulting in-plane distortions may be partly predicted from measurements of the wafer warpage prior to exposure, but may also depend on the way the wafer is clamped in the litho tool. In addition, usage of a certain deposition tool may further increase the likelihood of overlay error resulting from wafer deformation.

As another example, process-induced mark damage and stack thickness variations can lead to significant overlay errors with a rotational character, when an alignment strategy is used that is sensitive to changes in mark signal strength in certain wafers. As a third example, the elapsed time between two exposures may influence the magnitude of intra-field error signatures, given that the dose, reticle transmission, scanner throughput and illumination mode is likely to lead to field drift effects through each lot.

To make matters worse, effect of root causes can vary per product, so we cannot tackle the effect without taking into account the context of each product in terms of tool and processing contributors. Yield and performance therefore suffer when a new product begins to be processed, and diagnostic information learned for a previous product may simply be discarded.

These are just a few examples showing that complexity is already leading to problems in manufacturing of these products. Different types of factors contribute to the final errors, including mask and feature design, errors in lithography itself, pre-litho processing, metrology, process control. Many variables may be interdependent in analysis, and only a subset of them is predominantly related to the performance measurements (overlay, focus, CD and ultimately yield). However, which subset is responsible may be unknown initially. Finding back the root cause of some error is non-trivial, and calls for methods that can combine different data sources and give an estimate of the likelihood of certain factors being related to the performance penalties.

Using various diagnostic methods, data analysis is often done with certain types of data and certain suspected causes. After having done the analysis, an improvement advice and an analysis procedure for new datasets may be obtained. However, the analysis only "sees" the variables it is told to look at. Relations to non-identified or unobserved factors are left unclear. Also, data is typically not reused for new optimization or troubleshooting advice. For commercial reasons, data from different customers cannot always be shared or combined, and so generally-applicable learnings typically are not exploited in future production.

Referring again to FIG. 2, diagnostic sub-system 242 may be one of several diagnostic sub-systems, 242, 244, 246. However, using known techniques these do not interact to form a coherent diagnostic system. Each collection of object data and context data comprises a different model, or sub-domain of the potentially relevant context data. Results of different analyses in different domains (different models) are usually studied in isolation, and cannot be combined quantitatively. One problem in combining the models is the lack of complete knowledge about which variables are inter-related. A learning system, such as one based on a Bayes network, in theory can find for itself the inter-relationships between any numbers of variables. In practice, however, the amount of data required to identify all potentially relevant factors and interactions scales exponentially with the number of variables considered, and quickly becomes prohibitive.

There are in some domains physical (first principles) models (e.g. from knowledge of the litho tool components and control algorithms. These do not interface directly with data-driven models such as the PCA apparatus 250, or models that fit complex polynomials or other basis functions to the data. One would like to use as much as possible physically plausible parts in a model, but at the same time allow for data-driven fine-tuning. Therefore, though supported by many highly relevant analysis tools and domain knowledge, root cause analysis is often a fairly subjective exercise that focuses on a sub-problem using an incomplete dataset. Learnings on variable interactions and relevance to performance penalties are not quantified objectively and not easily reused for new product tasks, even when they are very similar to the old task.

In short, there is no 'global' holistic model that combines the 'local' sub-models per problem area in a sound, quantitative and reusable manner. This is inefficient use of data and domain knowledge, and may lead to partial and perhaps wrong conclusions, and loss of solution opportunities.
Multiple Sub-Domains in a Probabilistic Network Referring again to FIG. 2, there will now be described a diagnostic system implementing a network comprising two or more diagnostic sub-domains. Each diagnostic sub-domain may be analyzed by a diagnostic sub-system and method of any desired type, for example the sub-systems 242, 244 and 246 of FIG. 2. These sub-systems may be implemented on different hardware from one another, or on common hardware.

The probabilistic network, to be described in more detail below, is represented by the probabilistic inference unit 248 in FIG. 2.

In terms of the flowchart of FIG. 3, the probabilistic network and inference unit 248 are represented generally by a step S13, which connects inputs and/or outputs of the root cause analysis step S7 in a first diagnostic sub-domain with inputs and/or outputs of the root cause analysis step S7' in the second diagnostic sub-domain.

A first diagnostic sub-domain may comprise first diagnostic information extracted by analysis of first object data, the first object data representing one or more first parameters measured in relation to a first set of product units that have been subjected nominally to the same industrial process as one another. Following the example of FIG. 4, the first object data may be for example alignment data.

A second diagnostic sub-domain comprises second diagnostic information extracted by analysis of second object data, the second object data representing one or more second parameters measured in relation to a second set of product units that have been subjected nominally to the same industrial process as one another. The second set of product units may be the same as the first set, or different ones. The industrial process may be the same or different, between the first and second sets of product units. Depending on the sub-domain, measured parameters could be measured from the substrate before or after processing, such as alignment data, height map data or overlay data, or could be measured from the litho tool or other apparatus, rather than the substrate itself. As an example of the latter, lens aberrations may be associated with certain intra-field fingerprints. Intra-field wafer alignments can be modeled but this is a specialized expertise in itself. The aberrations may be tool-specific. They may be exacerbated by heat input in particular illumination modes, reticle transmission factors and so on, and may be time-varying. A specialized aberration model will have potentially many such context variables. Object data for an aberration model may include measurement data obtained from the patterning device (reticle alignment measurement data), or measured or modeled lens aberrations. Performance data could be densely measured intra-field overlay patterns measured with metrology apparatus 240.

While these sub-domains are defined distinctly and are substantially isolated in conventional diagnostic systems, the network implemented according to the present disclosure comprises at least one probabilistic connection from a first variable in the first diagnostic sub-domain to a second variable in the second diagnostic sub-domain In this way, part of the second diagnostic information can be being influenced probabilistically by knowledge within the first diagnostic information. These probabilistic network connections, together with an inference method for propagating information through the probabilistic connections, help to resolve the conflict between the need for a manageable number of variables per sub-domain, and quantitative integration between sub-domains, where knowledge of meaningful relationships may exist.

As mentioned already, the complete set of all possible context parameters is huge. Learning a Bayesian network directly simply by feeding it all the available data quickly becomes unfeasible. Fortunately, not all context parameters are likely to be equally important for the goal, namely root-causes of overlay or other performance deficiencies. Therefore, we propose to build for a graphical model example a Bayesian network with local models as building blocks. Reference to a "Bayesian network" will be understood as references to a probabilistic directed acyclic graph. These local models can for example be engineered initially using domain knowledge and experience, and enhanced with data mining techniques. Here, we propose that a global model implemented by inference unit 248 connects the sub-domain models into an overall graphical model. A Bayesian network (directed acyclic graph) is an example of a graphical model that can be applied successfully in this way. Each link in the network is a probabilistic connection. The existence of probabilistic connections between local models can be proposed by expert design, and/or discovered by automated data mining.

Figure 5:
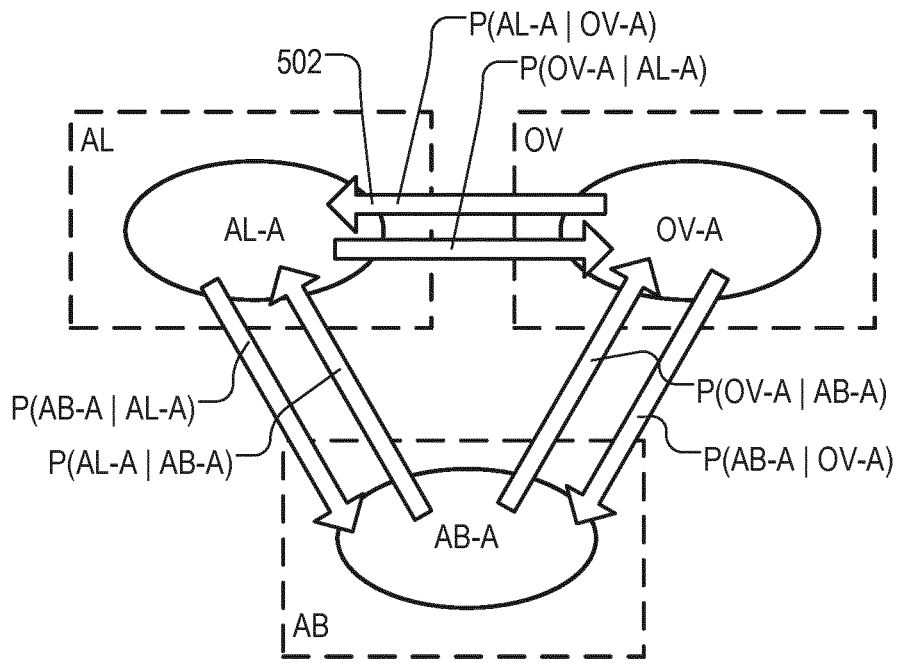
FIG. 5 illustrates the formation of a probabilistic network connecting sub-systems of a diagnostic system according to an embodiment of the invention.
Figure 5:
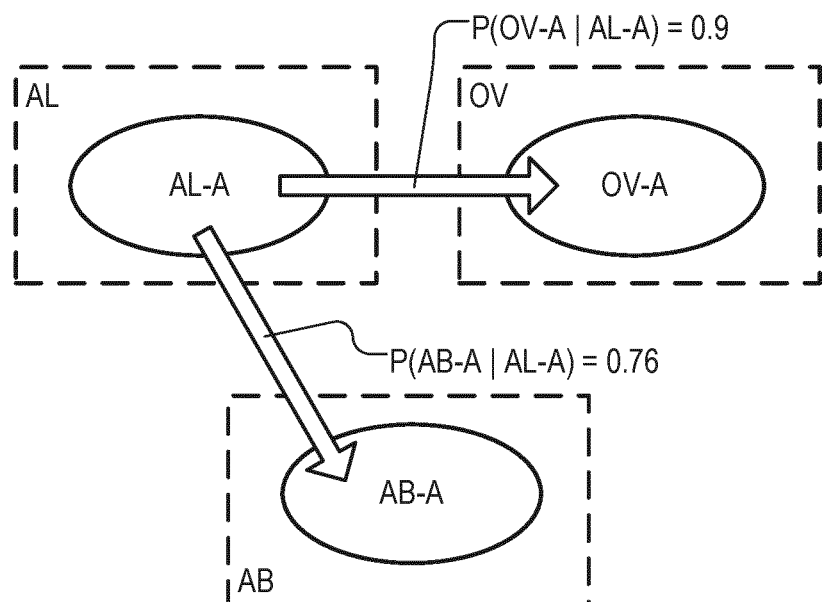

FIG. 5 illustrates the principle of combining a number of local models (here three) into a probabilistic graphical model. Local model AL represents a sub-domain based on alignment data as object data, similar to the example described above with reference to FIGS. 3 and 4. A parameter AL-A is a for example a fingerprint in the data, extracted from a large collection of data, for example by multivariate analysis. A second local model OV defines a sub-domain based on overlay measurements as object data, with a finger print OV-A occurring in some product units. Further a third local model AB is an aberration model, similar to the one described already above. A parameter of the model is the presence or absence of an aberration fingerprint AB-A.

FIG. 5(a) shows the set of local models AL, OV and AB that have been derived from data and/or expert knowledge, combined into a probabilistic graphical model. Each arrow represents a possible probabilistic connection from a variable in one local model to a variable in another local model. Each connection forms an edge in a directed graph. Each edge has a probability associated with it, which is a conditional probability. So, as illustrated, a connection 502 associates a conditional probability P(AL-A|OV-A), being the probability that fingerprint AL-A is found, given that fingerprint OV-A has been found. The presence or not of a fingerprint is only one type of variable that can be connected. Generally speaking, any variable can be a node in this network. The node can be an observed fingerprint, or a parameter in the context data, or a calculated quantity. The processing can be adapted to handle discrete and continuous variables, which is well within the capabilities of the person skilled in the art. A conditional distribution or conditional probability relating to the node may be restricted by the designer, for example. A conditional probability between two discrete variables will be used as a simple example of the connections of the network, without limiting the disclosure to such examples. The network may include discrete and continuous variables, as discussed. The influence of each connection can be calculated by complex algorithms, and need not be a simple conditional probability.

FIG. 5 (a) shows these variables combined in every in a global model having a fully connected graph (meaning that every possible edge potentially has a probability assigned to it). In practice, the graphs will not be fully connected, but more likely a subset of this graph is a more apt description of the underlying global model. FIG. 5(b) shows this situation, where only two edges are defined with probability values. The edge with probability value P(OV-A|AL-A)=0.9 indicates a very high conditional probability that fingerprint OV-A will be found in overlay sub-domain OV, given fingerprint AL-A has been found in alignment sub-domain AL. The edge with probability value P(AB-A|AL-A)=0.76 indicates a moderately high conditional probability that fingerprint AS-A will be found in the aberration sub-domain, where fingerprint AL-A has been found in the alignment sub-domain AL.

In the case of a true Bayesian network, permitting inference by Bayes' Rule, it is a requirement that there arc no cycles in the way the nodes are connected by knowledge of a probability. Therefore the bi-directional connections illustrated in FIG. 5(a) are not permitted if Bayesian belief propagation is to be used. In the event that a strong cyclic relation appears by design or by data mining, this can be worked around by treating the cyclically-connected nodes together as a single node in our directed graph. Then, although we can't reason within the cycle, we can use it to model the presence of some underlying phenomenon, that is present or not present, for example. The example of FIG. 5(b) satisfies the requirement for an acyclic directed graph, which permits use of Bayes' Rule to propagate knowledge.

Figure 6:
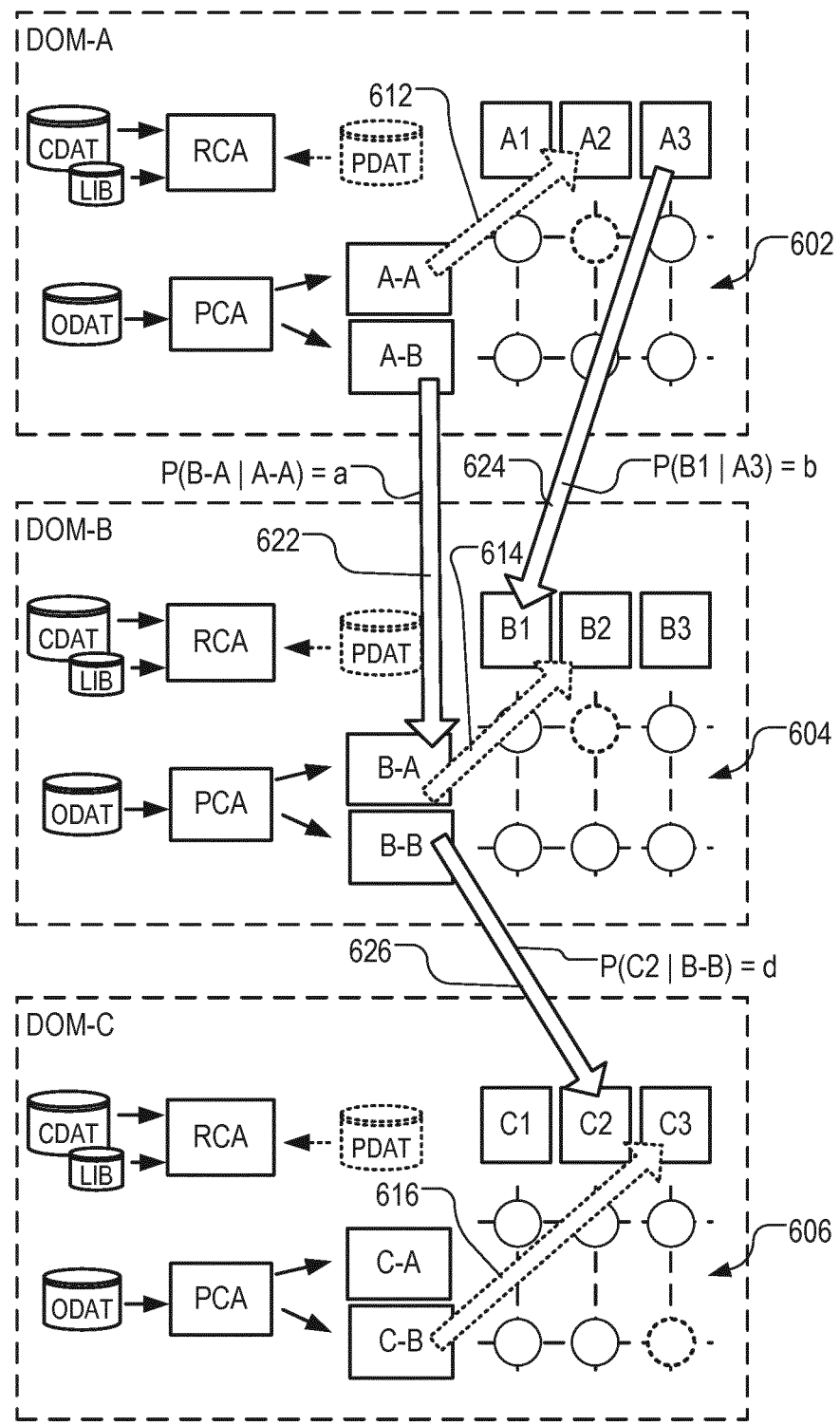
FIG. 6 illustrates the formation of a probabilistic network connecting variables within diagnostic sub-systems each of the type illustrated in FIG. 4.

FIG. 6 illustrates probabilistic connections forming a Bayesian network between different types of variable in three diagnostic sub-domains, DOM-A, DOM-B and DOM-C. Each of these sub-domains, purely by way of example, has the form of the diagnostic sub-system in FIG. 4. Thus, each sub-system has a first diagnostic apparatus (PCA apparatus) and a second diagnostic apparatus (RCA apparatus) for performing root cause analysis. Any or all of the diagnostic sub-domains may have a different form in practice, as already described with reference to FIG. 2. Instead of PCA apparatus, the analysis of object data may be physically based rather than data-driven, and/or may be data driven but in a different method than multivariate analysis.

Thus, purely by way of example, RCA apparatus within sub-system DOM-A provides a network 602 of weighted connections between observed fingerprints A-A and A-B on the one hand, and potential causes (e.g. tools used) A1, A2 and A3, as discussed in relation to FIG. 4. Similar networks 604, 606 exist within the other sub-systems. Connections shown dotted within each sub-system represent these connections already present within the sub-system. One of these dotted connections 612, 614, 616 is illustrated in each sub-system in FIG. 6, while the circles indicate that the network 602 has a full set of connections in practice. As mentioned above, the strengths of the connections in each network can be obtained by observation of data in a data-driven model, or by design knowledge in a physical model, or by a combination of both. The network 602 may comprise a directed acyclic graph, permitting inference and belief propagation by Bayes' rule.

To implement connections between sub-domains, a network of probabilistic connections forming a directed graph is defined by a set of edges connecting variables in different sub-systems (sub-domains, or local models), in the same manner as mentioned for FIG. 5. A connection 622, for example, gives a value to a conditional probability P(B-A|A-A), meaning that fingerprint B-A has that probability of being present in sub-domain DOM-B, when fingerprint A-B is found in sub-domain DOM-A. A swirl type fingerprint may for example arise in two different local models, and similar fingerprints may have very different causes in a real situation. This knowledge can now be represented and exploited in a robust and quantitative manner by a probabilistic connection between sub-systems that were previously operating independently.

Similarly, connection 624 gives a value to a conditional probability P(B1|A3), meaning that a feature B1 has that probability of being present in sub-domain DOM-B, when a feature A3 is present in sub-domain DOM-B. Following the example of FIG. 4, for example, one or both of these features B1 and A3 may each indicate usage of a particular tool. That is to say features A1 to A3 in this example are variables representing context parameters, and may be discrete (categorical) valued variables. As is the case within each local model, the strengths of the connections in each network can be obtained by observation of data in a data-driven model, or by design knowledge in a physical model, or by a combination of both. In a simple case, the variables A3 and B1 may actually represent the same tool, and the strength of connection 624 may indicate a conditional probability P(B1|A3) of 100%.

In the case where it is known that the variable A3 and B1 are truly equal (for example coming from the same PCA analysis of the same object data) then the system can be designed to recognize these as the same variable, present in two different sub-domains. An example of this will be described below and illustrated with reference to FIGS. 7 to 12. By defining a nodes which is common to two sub-domains, a probabilistic connection from a variable in one sub-domain to or from that common variable is automatically a connection between variables in the different sub-domains, within the meaning of the introduction and claims. Having a variable common to different sub-domains is not a requirement, however.

Connection 626 gives a value to a conditional probability P(C2|B-B), meaning that a feature C2 has that probability of being present when fingerprint B-B is observed in subsystem DOM-B. Because these are probabilistic connections, information can propagate between the sub-systems in a way not possible before. Very partial knowledge can be incorporated easily so that there is no need for a full set of connections having to be complete. More or fewer connections may be made between sub-domains, based on the knowledge available. Provided the directed graph formed by these probabilistic connections is acyclic, then Bayesian inference calculations can be made, to propagate information between sub-domains for improved root cause analysis.

Application Example

Figure 7:
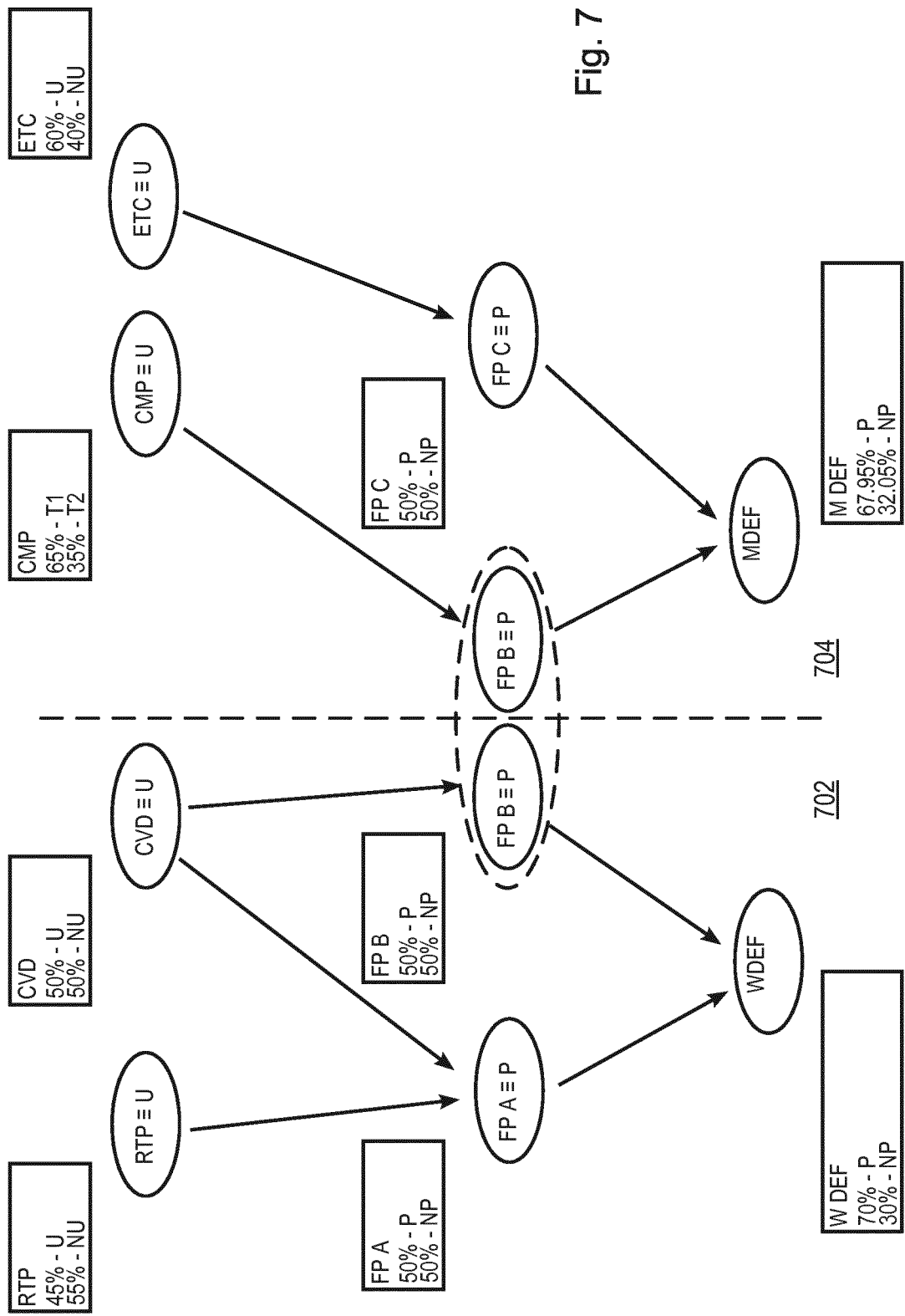
FIG. 7 illustrates an example network connecting variables within diagnostic subsystems.

In FIG. 7 we show an example of two local models 702 and 704. Below we will then show a network of probabilistic connections between working through different scenarios in FIGS. 8 to 12. For the time being, we see separate local models, such as may be implemented by the known diagnostic apparatus and methods. There may be further nodes and further existing connections within each local model (similar to the dotted arrows in FIG. 6) are omitted. Only some example nodes and connections that will be described as part of a global, probabilistic network are shown. The connections not shown within each subdomain can also be probabilistic.

Within each local model (sub-domain) 702, 704, different types of variables are illustrated in three layers. At the top of the diagram, in this representation, are context variables representing usage of different tools, or different types of tools. In the first sub-domain 702, context variable RTP has values U or NU (used or not used), indicating whether rapid temperature processing step (annealing) is a possible fingerprint generator for a given wafer or lot. Context variable CVD has values U or NU (used or not used), indicating whether chemical vapor deposition (CVD) is a possible fingerprint generator for a given wafer or lot. In the second sub-domain 704, context variable CMP has values T1 or T2 (Tool 1 or Tool 2) depending which of two possible chemical mechanical polishing tool has been used. Context variable ETC has values U or NU, depending whether a certain etching step has been used in the processing history of a product unit.

A middle layer of each local model, comprises observed variables, in this case observed fingerprints (FP) A, B, C obtained by multivariate analysis of object data. Each of these fingerprint variables (in this example) can have a value P or NP (present or not present). A bottom layer of the network in the representation of FIG. 7 comprises "explanation" variables. In the first local model (sub-domain) 702, an explanation variable WDEF indicates "the origin of this fingerprint is wafer deformation" while in the second sub-domain 704 an explanation variable MDEF indicates "the origin of this fingerprint is mark deformation" (an artefact in the alignment measurement, and not a real effect on the wafer). Thus we see that the first local model 702 may be one designed for diagnosis of wafer deformation effects, while the second local model 704 is one designed for diagnosis of mark deformation effects. Each of these local models may have been designed by a different expert, based on expectation of which parameters in the context data are likely to influence these different effects.

As described above and in the prior published application WO2015049087A1, a Bayesian network can be implemented within a diagnostic system to propagate belief and learning through the network in a quantitative and automated manner. In each sub-domain 702, 704 a Bayesian network is shown by arrows in FIG. 7, the directional edges generally point from processing tool usage to explanation nodes via the observed fingerprints. The structure of the graphical model (within a sub-domain and between sub-domains) can be learned given the evidence residing in the data. This structure reveals which features are related. Moreover, since the model is probabilistic it describes the scale of this relation.

Returning to the example of FIG. 7, initial probabilities, for example the ones shown in boxes beside each variable in FIG. 7, can be based on expectation or frequency of occurrence in the relevant data set. For example, it may be known that annealing (RTP) is used on 45% of the wafers, CVD is used on 50% and so on. In the absence of prior information, the probability of each fingerprint A, B and C can also be set at 50%. In practice, Bayesian reasoning is an on-going and iterative process, as already described. Therefore the values of the explanation nodes MDEF and WDEF in general can be the most recent posterior from previous analyses. In the terminology of Bayesian networks, this way, the latest "posterior" becomes the "prior" for new analysis. Initial values can also come from computing relative frequencies from a database, or by postulating for example a so-called uninformative prior. This uninformative prior can be a mathematically defined distribution, for example a uniform distribution or Jeffrey's prior. Given more data, the conditional probabilities can be refined to further improve accuracy. This recursive learning is one of the inherently strong aspects of the Bayesian frameworks. Similarly, it can be fed with prior probabilities to transfer earlier learnings into the network. This can allow for an increase in the speed of diagnostics when analyzing new cases.

If context data for CVD (for example) is simply not known, the frequency can be set for example at 50% as a starting estimate. This estimate can be influenced later by inference from data known in other local models, allowing inferences to be drawn in a local model, for which the required context data required would otherwise be completely missing.

In this example, the fingerprint represented by variable FP B may be the same fingerprint, but conventionally each local model will use the fingerprint variable for its own purposes, with no communication between models. When the same or similar fingerprint is observed, the root cause may be different and the best correction or prevention strategy may also be different. Neither of the local models by itself can assess the likelihood of these competing explanations, but this becomes possible with the probabilistic network of the present disclosure.

As an example of the global model enabled by the present disclosure, the fingerprint variable FP B can be made into a common node in the probabilistic networks of both sub-domains 702, 704. This is one way of creating a network connecting the local models into a global model, so that learning and knowledge in one sub-domain can be propagated in a quantitative manner into another sub-domain.

Various methods of using and updating the network of FIG. 7 will now be described, with reference to FIGS. 8 to 12. In these diagrams, inference unit 248 is illustrated, which uses Bayes' Rule to exploit the further reasoning potential of a Bayesian network. Principles known to the person skilled in the design and operation of Bayesian networks can be applied in the design of the system. While the present disclosure presents network connections as simple conditional probabilities, the skilled person will know that the mapping mechanism implemented in a connection could be more complicated than a single conditional variable. For example, a target variable may be defined as having a certain part and an uncertain part, and the network connection influences only an estimation of the uncertain part. Many specialized tools are available for this purpose, and the details are not described in the present disclosure.

In FIGS. 8 to 12, a visual convention is used. A solid box around a node in the network (for example node FP B in the FIG. 8) indicates a variable fixed or "clamped" by reference to knowledge object data and/or context data The value of a variable can be a vector, if the variable/node is multidimensional. Dashed boxes are used to represent variables updated by inference unit 248 (for example nodes CMP and MDEF in FIG. 8). Dashed arrows (for example 802, 804 indicate schematically that knowledge can propagate by inference in either up or down directions between the layers, while the network connections themselves are always (in this diagram representation) directed downwards.

Figure 8:
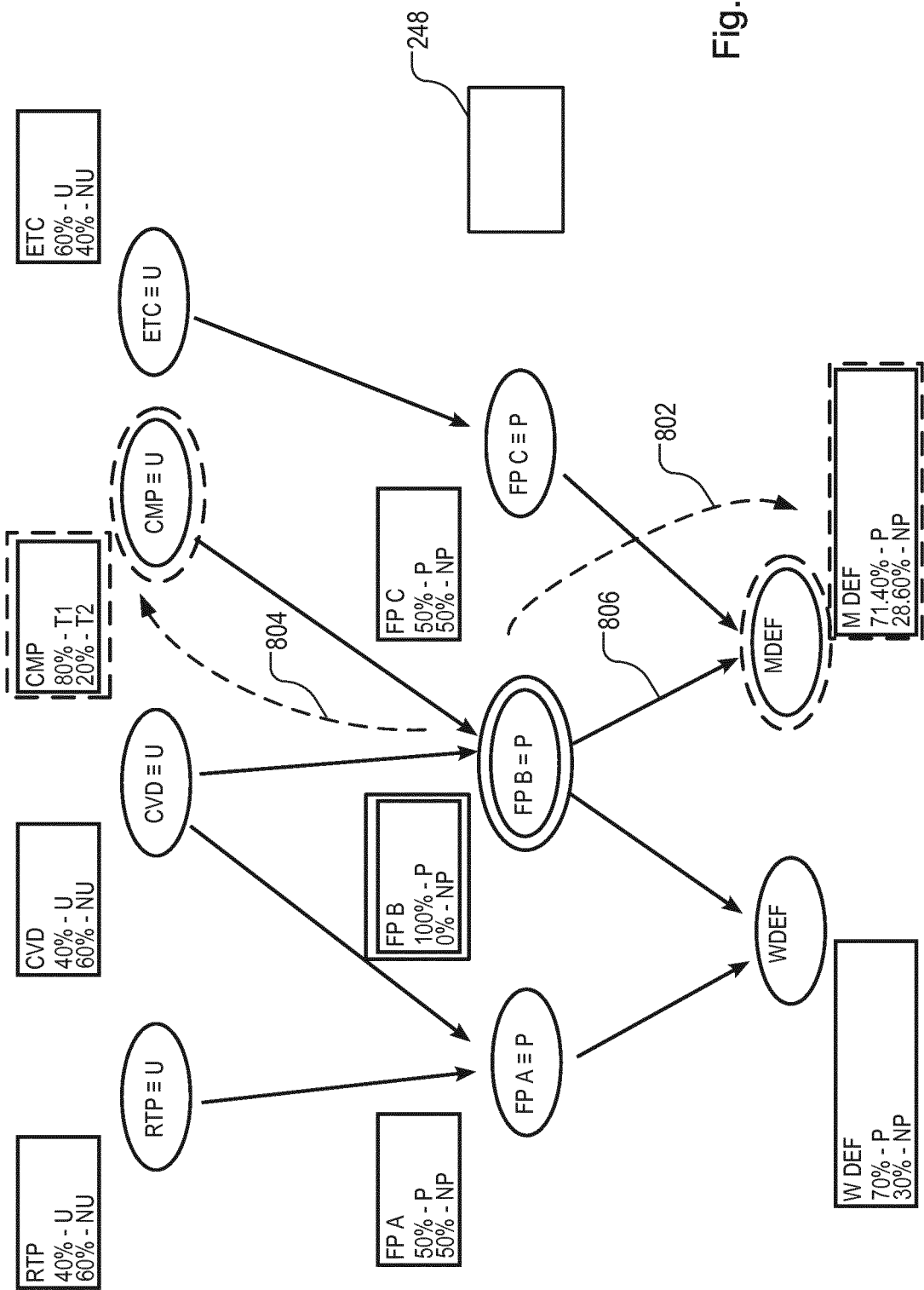
FIGS. 8 to 12 illustrate various methods of using and updating the network of FIG. 7.

FIG. 8 illustrates the changes in the diagnostic system when it observes a rotation-like fingerprint B on a wafer. Variable FP B=P is clamped with a value indicating 100% certainty, indicated by the solid box. Through the network connections previously established, the likelihood of mark deformation goes up to 71.4% (dashed box; inference 802). Another inference (arrow 804) suggests an increased likelihood that a faulty CMP tool T1 is involved, based on domain knowledge on typical CMP fingerprints, which is encoded in the network. Inference 802 is a direct consequence of the probability value associated with the connection labelled 806, while inference 804 flows back through the network, by operation of Bayes' Rule and inference unit 248. This "backwards" propagation can be implemented by an iterative process, as is well known in the field of Bayesian networks. The increased likelihood of the faulty CMP tool could (though not illustrated here) be used in another part of the local model. The increased likelihood of the faulty CMP tool could (though not illustrated here) be used in another local model, which otherwise would lack any knowledge on the tool used.

Figure 9:
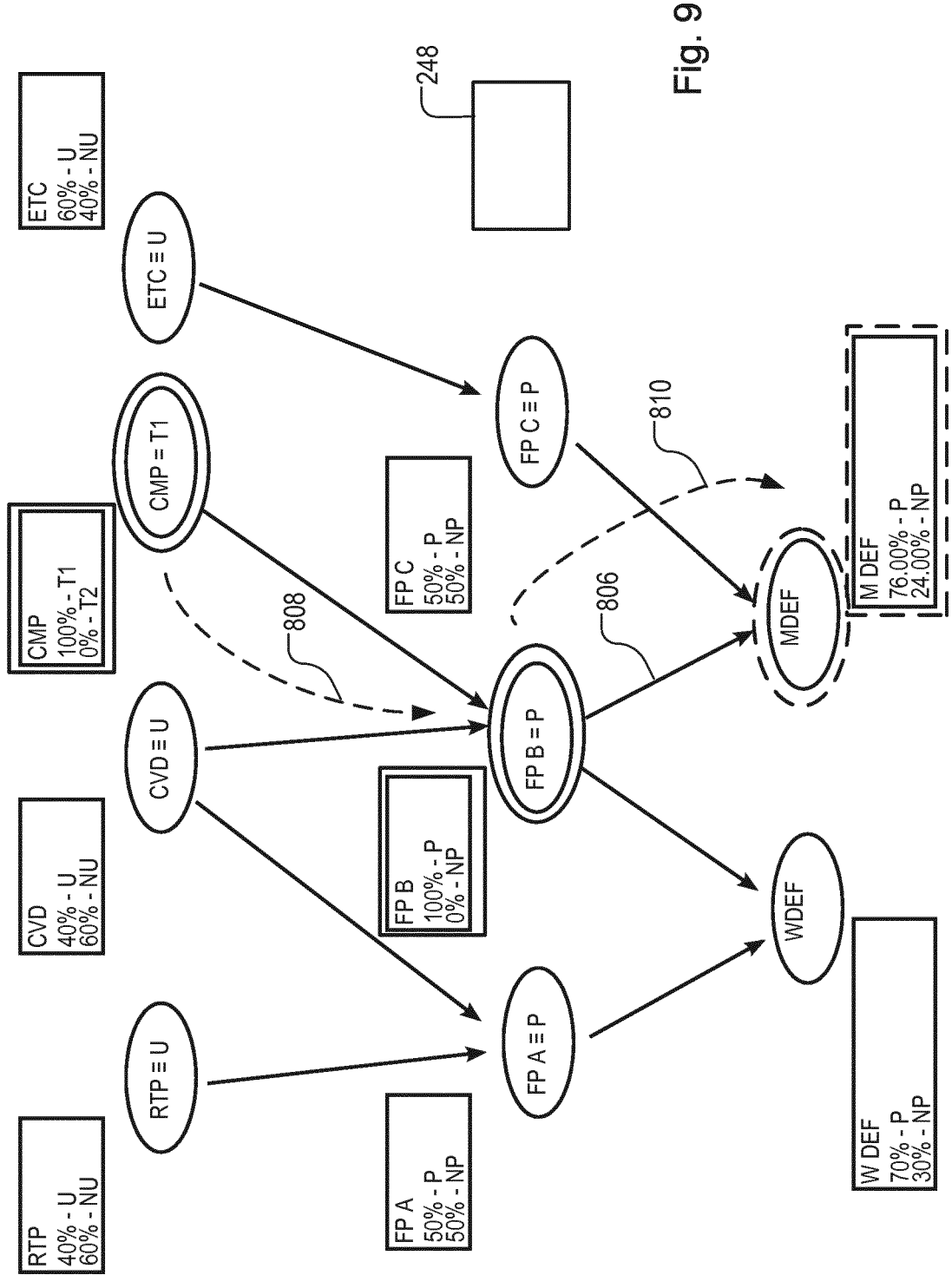

FIG. 9 shows a piece of context information being added to the scenario illustrated in FIG. 8. Suppose context data is received to say that a faulty CMP tool T1 was indeed used. The value of that CMP node is fixed at P with certainty 100% accordingly. The information propagates through the network by inferences 808 and 810. The likelihood of mark deformation as an explanation is further increased, indicated by a rise in the probability represented by variable MDEF, even though the presence of fingerprint B is unchanged. In an advisory mode, a report may be output with this updated probability as diagnostic information in its own right, optionally with suggested corrections. In a controlling mode, a correction may be output for use in controlling subsequent processing, for example to avoid use of a certain tool, or for scheduling maintenance.

Figure 10:
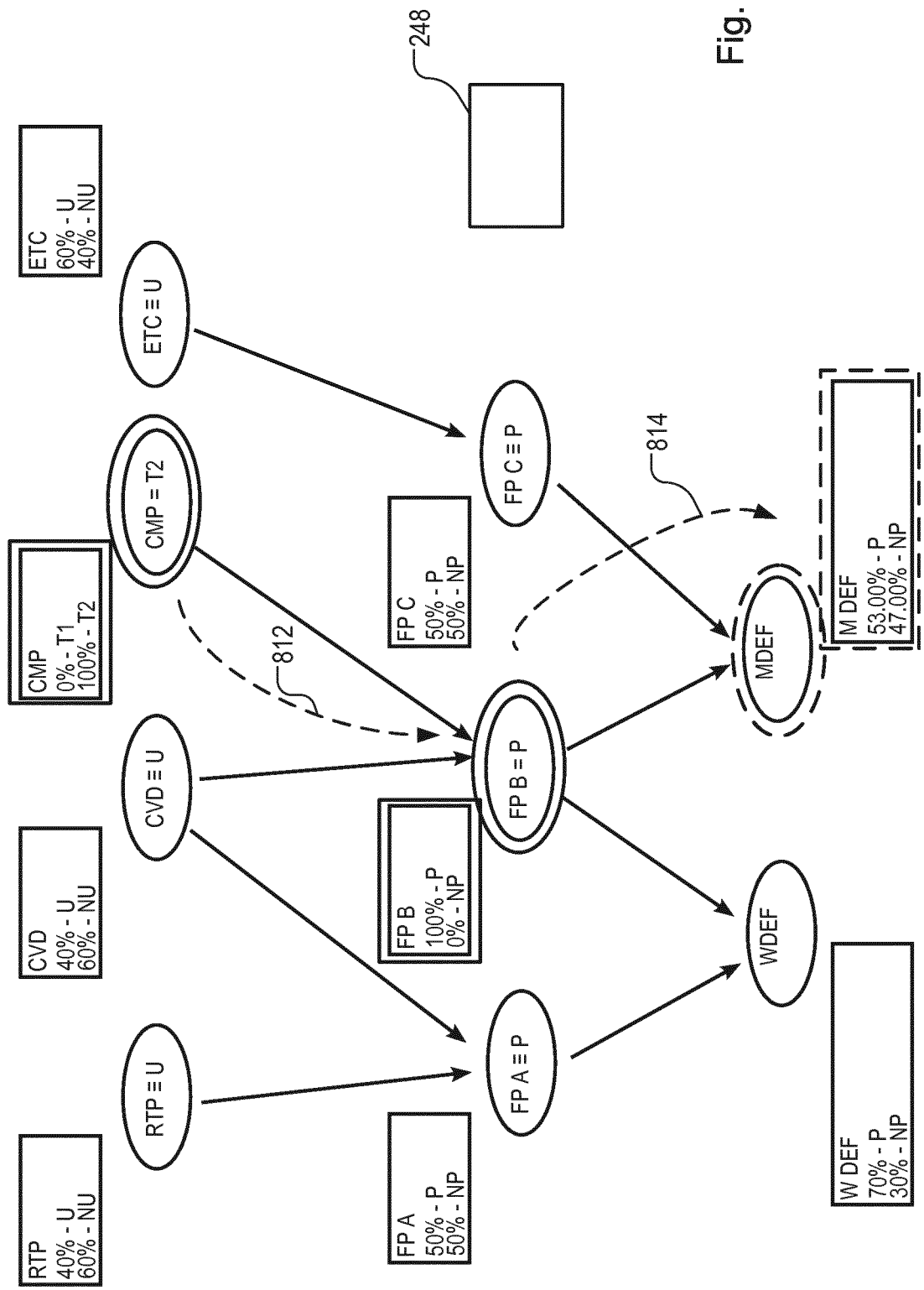

FIG. 10 shows the opposite scenario to FIG. 9, starting from the situation of FIG. 8. It is determined that the used CMP tool is within specifications. Say the used CMP node is clamped to 100% T2. Through inferences 812 and 814, the probability of mark deformation decreases. The fingerprint B is still present in the object data, but the probabilistic network allows the inference to be made that the cause of the fingerprint is more likely to be something else. In an advisory mode, a report may be output with this information.

In this particular example, the probability of wafer deformation represented by variable WDEF does not increase, presumably because the connection between variable FP B and variable WDEF is very weak in the local model for sub-domain 702. In another example, it could be found that the variable WDEF increases as a result of the connection between the sub-domains, in the same way as variable MDEF decreased. In the present example, the implication is that there could be a third explanation of the observed fingerprint. A third local model could be implemented which would pick up this third explanation. Such a third local model could be related to for example metrology accuracy.

Figure 11:
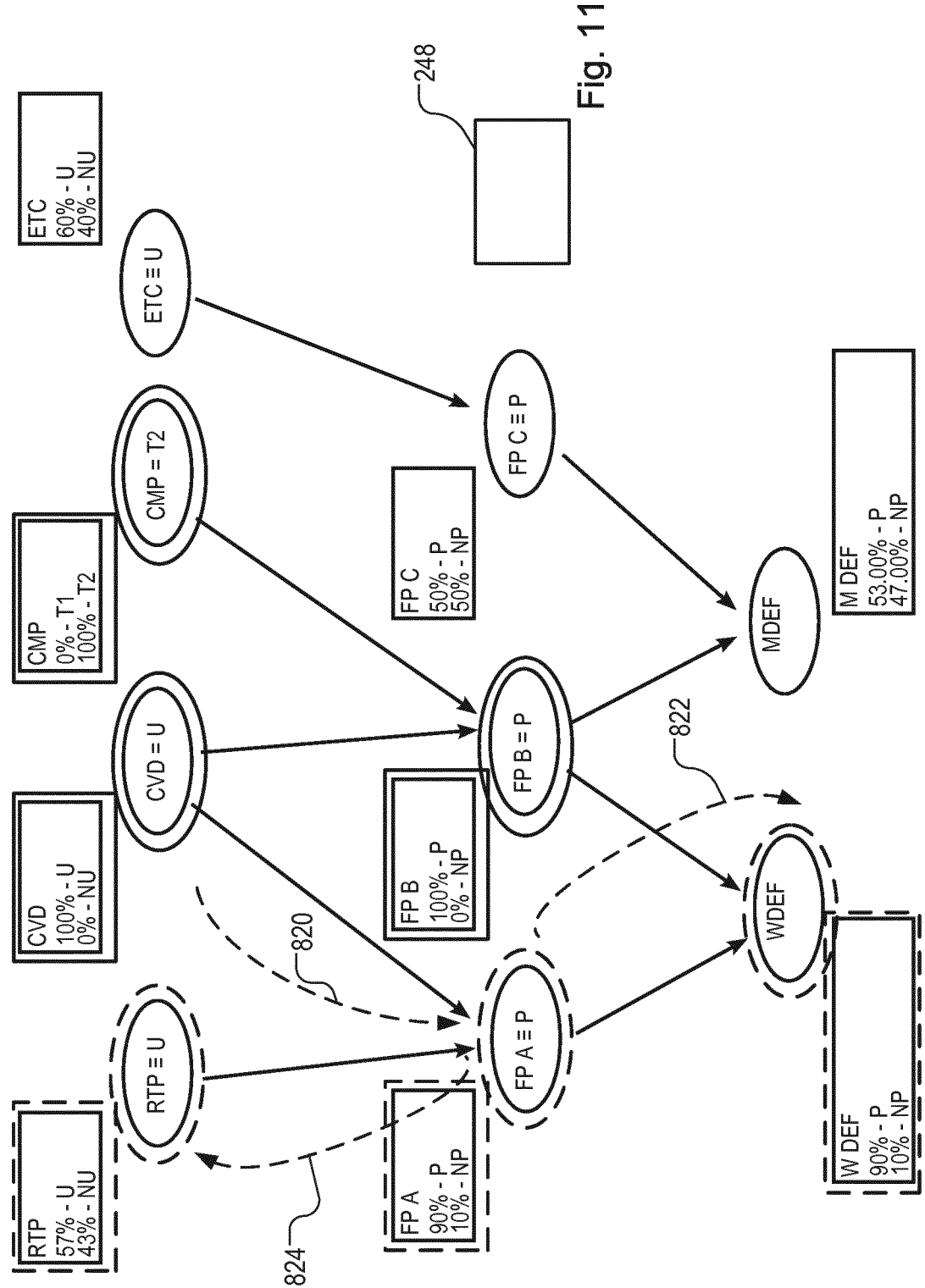

FIG. 11 further develops the scenario of FIG. 10 with additional context information. It will be understood that this context information may in fact be available from the start. It is useful to show how each different piece of information can propagate through the network, so it is explained here as a separate step. Even if the knowledge of context data is available from the start, in some embodiments the option to make inferences from knowledge outside the local model can be enabled and disabled by a user option. This allows the system operator to see it as a separate effect, to assist overall diagnosis. The generated reports may have alternative conclusions, showing the effect of including or not including the additional information. Some of the nodes (e.g. CMP faulty/not faulty) could be set purely by user experiment, to allow "what if" experiments. The sensitivity of a particular result to a particular context variable can be tested in this way. This can again be used to guide further investigations. It may also help to weed out connections that are not actually meaningful, and to lead to refinements of the assumed model (probabilistic network). These refinements may be fully automated, or wholly or partially manual.

Returning to the example of FIG. 11, context information is added that a CVD step was also used on the wafer. Therefore, CVD node is clamped to U (100%). This is not the same as saying that a faulty tool is used. This is different to the example of the CMP variable of FIGS. 9 and 10. Rather the variable CVD when set to U is saying that a CVD step was involved in the processing of this product unit or units, and is not known to be free of faults. Therefore the CVD step is potentially a cause of a certain fingerprint or other observation. By action of the network of probabilistic connections, inferences 820 and 822 lead to an increase in the probability of additional wafer deformation, and a higher likelihood of deposition fingerprint A on the W. Moreover, by inference 824 the probability increases that annealing (RTP) was used. The variable CVD is binary (100% or 0%) in this example, but could be multi-valued (continuous) if desired For example a newly set up machine could be assumed good, and then uncertainty is allowed to grow with time. The variable could be a multi-valued discrete variable, like good, medium, bad, or it could also be some measurement representing the CVD tool condition, and having a continuous value.

Considering that the wafer deformation local model is otherwise quite distinct from the mark deformation local model, the addition of probabilistic connections allowed inferences to be made about the (probable) presence of a fingerprint FP A and a processing step (RTP), even when object data and/or context data is not available to observe them directly. This can be useful in itself, within the wafer deformation sub-domain there may be a shortage of other information. It may also be useful in that connections to yet further sub-domains (not illustrated) can make use of the information. The usefulness of this information may be equally useful in highlighting a probable or possible cause, and in showing that an apparently probable cause is not likely to be the cause in the present context.

Another mode of exploiting the additional knowledge gained by connecting the sub-domains into a global model. Information from another sub-domain can be used to down-weight specific measurement data when used in another sub-domain. Using the example of the sub-domains illustrated in FIGS. 7 to 12, modelling of wafer deformation will be improved if it is known which measurements of alignment marks and/or which overlay metrology targets are unreliable due to suspected mark deformation. More specifically, by estimating the likelihood that a certain alignment mark or overlay metrology target is deformed and picks up mark deformation rather than wafer deformations, the system or system operator could down-weight the influence of this mark measurement on the total computed correction. In terms of the lithographic apparatus and the method of FIG. 3, corrections generated in step S11 may specify which measurements to down-weight in future operations.

Such an application is an extension of a technique disclosed in prior published applications of Lyulina et al, such as US2012218533A1 and US2015146188A1. US2012218533A1 discloses methods of correcting alignment using radial basis function (RBF) models, including a "relaxation" function for reducing susceptibility to outliers among the measured marks. US2015146188A1 discloses methods for determining the usefulness of particular marks in alignment. The contents of these publications are hereby incorporated by reference. The extension described herein allows de-weighting to be based on an estimate of the probability of mark deformation affecting a specific measurement, rather than trying to judge what are outliers from the measurements (object data) alone themselves. For example, a sample may conventionally be identified as suspect if it is an outlier, having a high residual value when compared with a model fitted to the data. The extended method disclosed herein can identify and down-weight a certain mark, even if it happens not to be an outlier on the face of the object data. this identification and down-weighting is based on evidence about the mark's reliability, from another sub-domain in the global network. The down-weighting in this manner is not limited to examples where diagnostic information is for fault diagnosis. The diagnostic information in this context can have a variety forms and purposes, whether it implicitly or explicitly connects observed behavior with a possible or likely cause. The term "diagnostic information" encompasses for example alignment corrections to be applied in controlling the position of patterns applied to a substrate in subsequent processing, irrespective whether any action or conclusion is made as to the root cause of an error. The term "diagnostic information" also encompasses information used in the correction of a root cause, irrespective whether it is output to an operator in the form of any report.

FIG. 12 illustrates a further development from the scenario of FIG. 11. After further investigation, the operator is told that the used CVD tool is within specifications. Therefore, the CVD variable node is clamped to NU (0%). Fresh inferences 830, 832 and 834 are made to propagate this new knowledge through the network. As a consequence, the probability of wafer deformation decreases, the probability of fingerprint A being present decreases, and the probability that RTP is a potential cause of error also decreases. Again, we see that the network allows inferences to be drawn that otherwise would require additional observations.

Numerous other scenarios are of course possible, and the network of probabilistic connections can be made in many ways and between any number of different domains, according to the available knowledge. The knowledge underlying the choices of connections can be expert knowledge that exists today, but hitherto has had no means of quantitative and robust expression in an automated advisor or automated controller. The knowledge of which connections are or may be relevant to overall process performance can also be learned by the system without expert knowledge.

In order to build the network structure (in contrast to populating the network's connection probabilities), a domain expert can rely on his/her domain knowledge to select promising input variables, to be considered as nodes, that will feed information into the network. These can be variables in a context layer, an observation layer and/or an explanation layer.

As the available context data is typically vast in the parameter space, in addition to utilizing his/her domain prior knowledge, the domain expert can explore the available context data by means of (interactive) data mining tools to automatically discover local models in the data that can serve as promising input nodes. For example, if by means of pattern mining some processing tool or set of processing tools seem to occur often with 'faulty wafers', these are potentially interesting variables for the network to observe, and therefore to add to the network as input nodes. The human expert does not need to know why or how they may be implicated: it is valuable in itself to know which of the many possible variables could be worth including in the root cause analysis.

Figure 13:
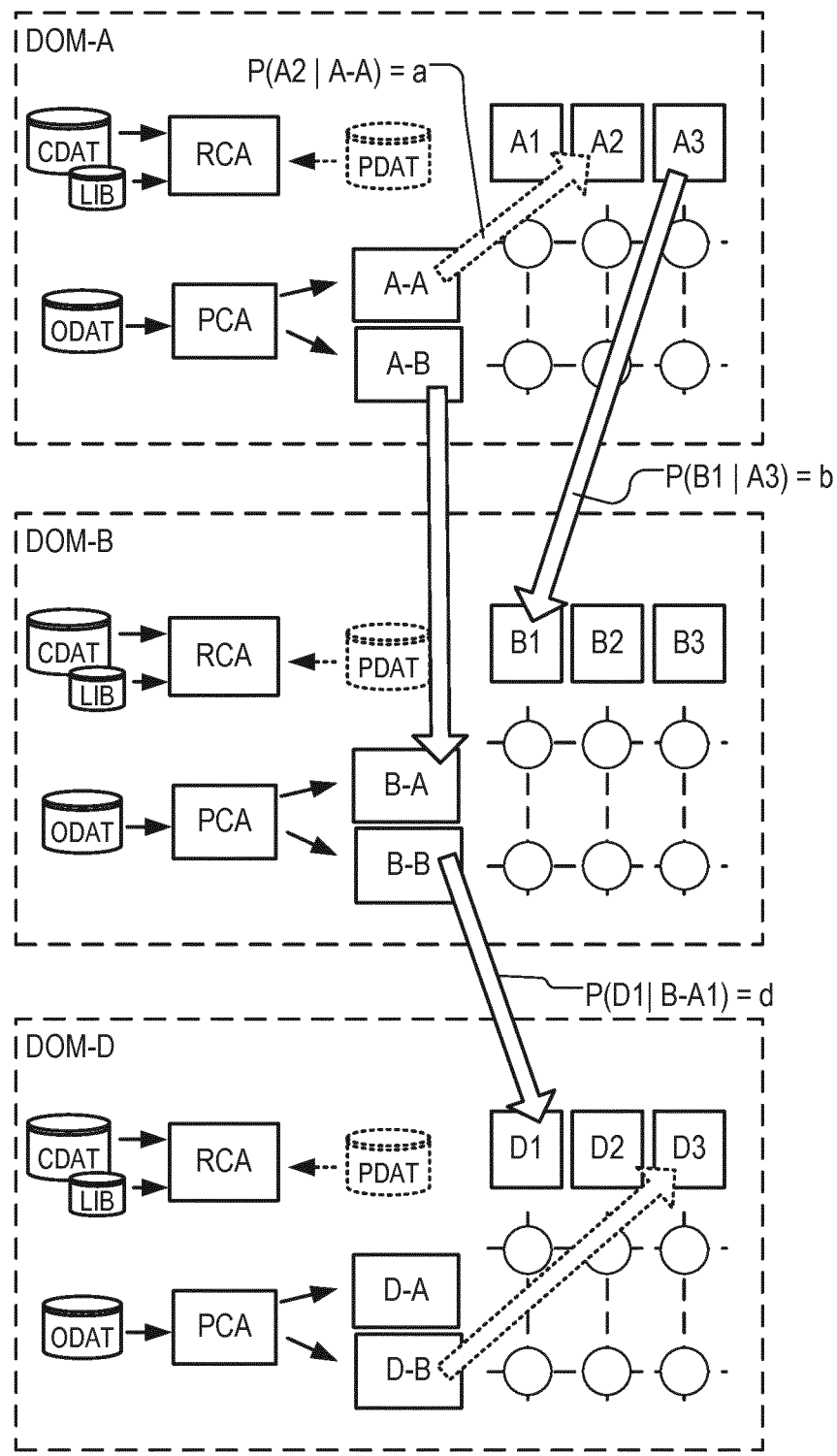
FIG. 13 illustrates another example of the formation of a probabilistic network connecting variables within diagnostic sub-systems.

FIG. 13 illustrates simply the ability to reuse much data and learning, by incorporating a new local model into a probabilistic network with existing local models. The diagnostic system is the same as that shown in FIG. 6, except that the third sub-subsystem DOM-C has been replaced by another one DOM-D. This could be because of a small change in product type, or a new tool being used which makes the object data of sub-system DOM-C redundant. As mentioned in the introduction, such a scenario currently often involves discarding almost all diagnostic information and starting from scratch. This is inefficient and may degrade yield and increase the cost of introducing a new product. FIG. 13 illustrates how the probabilistic connections may still allow knowledge from other sub-domains to be re-used and not wasted in the new local system.

To implement this re-use, the designer of the network decides that, although the process or product associated with the new sub-domain D is different to that associated with the old sub-domain C, some similarities can be postulated. Context variable D1 may for example be similar to variable C2 in FIG. 6. They may relate to usage of the same tool, though the product has changed, or they may relate to some subset of the layers and steps within the overall production process. From this observation, the connection 902 with conditional probability $P(D1|B-A1)=d$ can be added, to benefit immediately from the prior learning, and from knowledge in the other sub-systems (local models) DOM-A and DOM-B. The probability of this connection can of course be adjusted as experience of the new product or process is added. The value of the added connection can be tested by enabling and disabling it, in the same manner as described above.

Hardware Implementation

Figure 14:
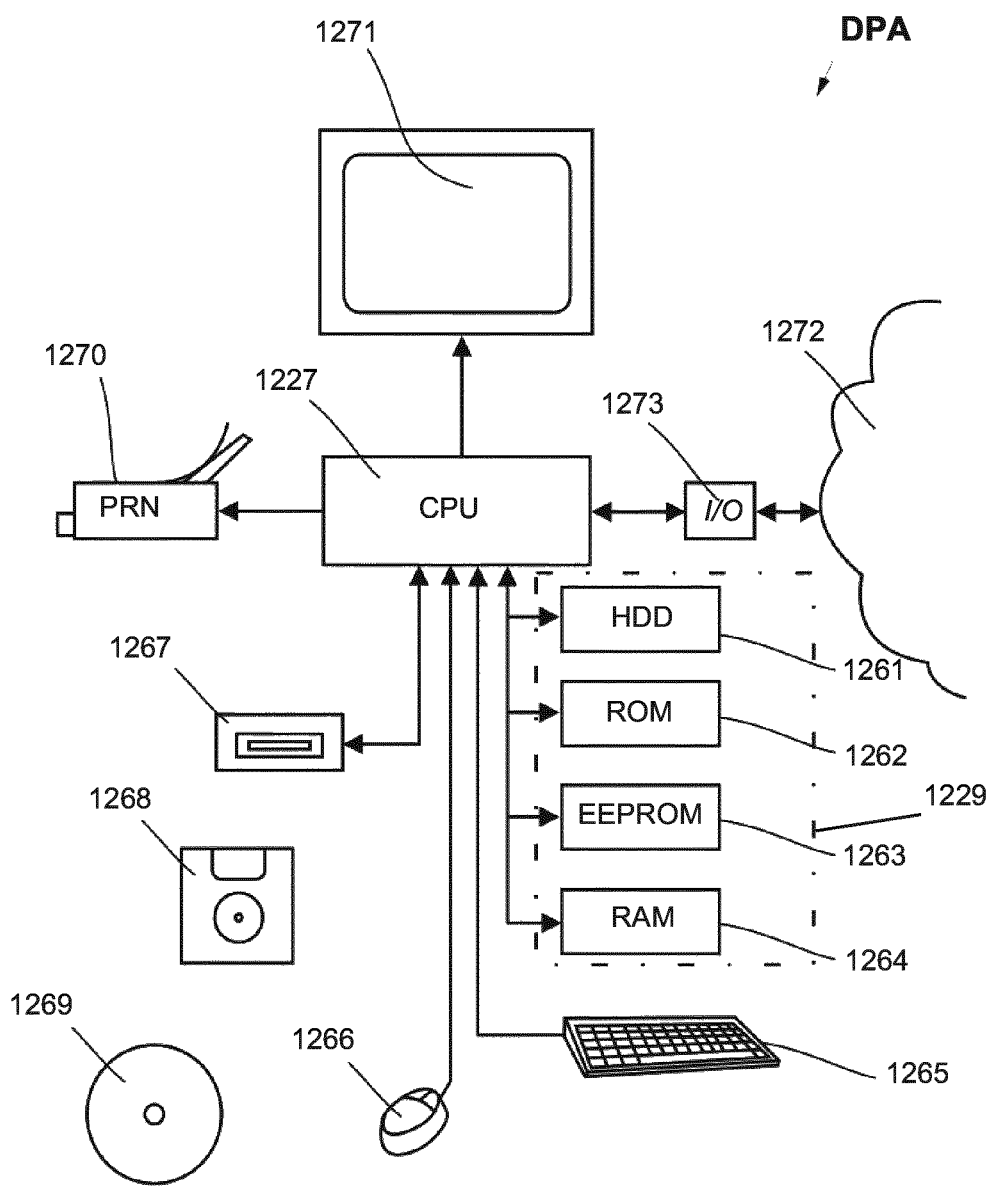
FIG. 14 illustrates schematically data processing hardware programmable to implement the first and/or second diagnostic apparatuses of the embodiments of the invention.

The steps of the methods described above can be automated within any general purpose data processing hardware (computer), so long as it has access to the object data and, if desired performance data and context data. The apparatus may be integrated with existing processors such as the lithography apparatus control unit LACU shown in FIG. 1 or an overall process control system. The hardware can be remote from the processing apparatus, even being located in a different country. Components of a suitable data processing apparatus (DPA) are shown in FIG. 14. The apparatus may be arranged for loading a computer program product comprising computer executable code. This may enable the computer assembly, when the computer program product is downloaded, to implement the functions of the PCA apparatus and/or RCA apparatus as described above.

Memory 1229 connected to processor 1227 may comprise a number of memory components like a hard disk 1261, Read Only Memory (ROM) 1262, Electrically Erasable Programmable Read Only Memory (EEPROM) 1263 and Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Connections between modules can be made wired or wireless.

The computer system can be any signal processing system with analogue and/or digital and/or software technology arranged to perform the functions discussed here.

CONCLUSION

The techniques disclosed herein bring a number of benefits not available within an automated or semi-automated diagnostic system up to now. These are mentioned in passing above, and may be itemized in summary as follows.

By combining local models probabilistically, rather than trying to include all variables in one model, the overall inference remains tractable.

Network structure can be based on domain knowledge concerning the local models and their interactions.

Local models can be combined to give more 'holistic' estimates of the likelihood of the potential root causes, including the uncertainty regarding the involvement of a potential factor.

As more data or more knowledge from other use cases is obtained, the quality of the diagnostic information goes up (uncertainties are reduced); if the data is unreliable, noisy or conflicting, the prior knowledge (historic object data or expert domain knowledge) prevails.

The system operator will gradually build up a 'knowledge base' on the way that contextual factors throughout the production facility and process typically interact and relate to on-product performance parameters. This allows data and heuristics from many different use cases to be condensed into a global reasoning model. Such a probabilistic expert system will get more accurate and complete as experience of different scenarios builds over time.

The system is applicable in different degrees of automation. First usage might for example be as an advisory system for decision support in field service. Once the model is deemed accurate enough it can be elevated to be a part of an optimal control strategy, directly controlling parameters of the litho tool and other processing. Some parameters may be controlled directly on the apparatus, others through recipes for lithography, metrology and so forth.

In the litho tool, currently the optimization of corrections in-line depending on the relevant fab and scanner variables is a difficult problem and requires a combination of off-line elicited prior knowledge on variable interactions and in-line metrology from the litho tool (200) and metrology apparatus (240). Identifying the relevant variables they that influence performance of the resulting product units is key to finding optimized control actions.

The system can be exploited could ultimately to advise how to combine the measurements from many different sub-systems of the litho tool into one set of optimal corrections for a certain use case.

Possible applications of the diagnostic system are mentioned in the above description, and may be itemized and summarized as follows:

Relating processing tool usage to overlay error (particularly inter-field fingerprint) and optimizing routing and tuning of processing tools.

In-line mapping of wafers to context-specific control threads.

In-line suppression of unwanted contributions to wafer measurements (noise; mark/target asymmetry). More specifically, by estimating the likelihood that a certain alignment mark or overlay metrology target is deformed and picks up mark deformation rather than wafer deformations, the system or system operator could down-weight the influence of this mark measurement on the total computed correction.

Root cause analysis of overlay penalties with performance data measured on product units at a production facility.

Machine diagnostics—Assessing which factors are likely causes of a litho tool or metrology apparatus operational malfunction or hiccup. Although the above examples are concerned primarily with product performance, the principles of the disclosure are also relevant and applicable for operational diagnostics of the processing apparatuses such as the litho tool itself. The outcome can influence maintenance schedules and/or redesign.

The term "product unit" as used herein does not imply that these units are intended eventually to be completed and sold commercially, nor that they are even functional products at all. The term "product unit" should be understood to include product units designed and/or processed purely for development or diagnostic purposes.

Further embodiments of the invention are disclosed in the numbered clauses below:

1. A diagnostic system for use in relation to an industrial process, the system implementing a network comprising two or more sub-domains,
   wherein at least a first one of said sub-domains comprises first diagnostic information extracted by analysis of first object data, the first object data representing one or more first parameters measured in relation to a first set of product units that have been subjected nominally to the same industrial process as one another,
   wherein at least a second one of said sub-domains comprises second diagnostic information extracted by analysis of second object data, the second object data representing one or more second parameters measured in relation to a second set of product units that have been subjected nominally to the same industrial process as one another, and
   wherein said network further comprises at least one probabilistic connection from a first variable in the first sub-domain to a second variable in the second sub-domain, part of the second diagnostic information thereby being influenced probabilistically by knowledge within the first diagnostic information.
2. A diagnostic system according to clause 1, wherein said network comprises a directed acyclic graph.
3. A diagnostic system according to clause 1 or 2, wherein said network includes one or more further probabilistic connections between variables within the first and/or within second sub-domain.
4. A diagnostic system according to clause 1, 2 or 3, wherein the diagnostic system is arranged to perform one or more Bayesian inference steps using the network so that a variable within the first sub-domain is influenced by propagation of belief from within the second sub-domain.
5. A diagnostic system according to any of clauses 1 to 4, wherein the first variable represents a spatial fingerprint observed in the first object data.
6. A diagnostic system according to clause 5, wherein the said spatial fingerprint is derived by performing a multivariate analysis on the first object data.
7. A diagnostic system according to any of clauses 1 to 6, wherein the first variable comprises a piece of context data representing a parameter of the industrial process as applied to each individual product unit.
8. A diagnostic system according to clause 7, wherein in the first diagnostic sub-domain the system is arranged to extract said first diagnostic information at least partly by identifying correlation between a spatial fingerprint observed in said first object data and said piece of the context data.
9. A diagnostic system according to any of clauses 5 to 8, wherein the significance of a spatial fingerprint in the first sub-domain is reduced based on diagnostic information obtained in the second sub-domain.
10. A diagnostic system according to any of clauses 1 to 9, wherein the significance of certain measurements used in the first sub-domain is selectively reduced based on diagnostic information obtained in the second sub-domain.
11. A diagnostic system according to any of clauses 1 to 10, adapted for use where said industrial process comprises a sequence of one or more lithographic processing steps performed on product units in the form of substrates, and wherein said first variable and/or said second variable include positional deviations that are measured automatically at locations spatially distributed across each substrate in performance of said lithographic patterning operation.
12. A diagnostic system according to clause 11, wherein said object data includes spatially distributed measurements of one or more of overlay, critical dimension, side wall angle, wafer quality, focus.
13. A diagnostic system according to any preceding clause, wherein the analysis in at least one of the first and second sub-domains further includes performance data representing one or more performance parameters measured for each product unit.
14. A diagnostic system for an industrial process, the diagnostic system comprising:
   a first sub-domain comprising first diagnostic information associating probabilistic first context data to a first product unit based on one or more first parameters measured in relation to the first product unit; and
   a second sub-domain distinct from the first diagnostic sub-domain, the second diagnostic sub-domain comprising second diagnostic information associating probabilistic second context data to a second product unit based on one or more second parameters measured in relation to the second product unit,
   wherein the diagnostics system further comprises an interface between the first diagnostic sub-domain and the second diagnostic sub-domain configured to implement a probabilistic connection between the first context data and the second product unit.
15. A diagnostic system according to any of clauses 1 to 14, wherein the second variable represents a spatial fingerprint in the second object data.
16. A diagnostic system according to any of clauses 1 to 15, wherein the first variable forms an explanation node within the first diagnostic sub-domain.
17. A diagnostic system according to any of clauses 1 to 16, wherein the second variable forms an explanation node within the second diagnostic sub-domain.
18. A diagnostic system according to any preceding clause, wherein the analysis in at least one of the first and second sub-domains further includes context data representing one or more parameters of the industrial process as applied to each individual product unit, and further arranged to extract diagnostic information using said context data.
19. A diagnostic system according to clause 18, wherein, by operation of said probabilistic connections, an analysis based context data in one of the first and second sub-domains is arranged to propagate into the other of said sub-domains.
20. A diagnostic system according to clause 18 or 19, arranged to extract said diagnostic information at least partly by identifying correlation between the identification of product units as being of interest based on said component vectors and one or more parameters in the context data.

21. A diagnostic system according to any preceding clause, adapted for use where said industrial process includes performing one or more lithographic, physical and/or chemical operations by different individual processing apparatuses on different individual product units, and wherein said context data includes at least one parameter identifying the individual processing apparatus used for a given operation.

22. A diagnostic method for an industrial process, the method comprising:
implementing a first sub-domain comprising first diagnostic information associating probabilistic first context data to a first product unit based on one or more first parameters measured in relation to the first product unit;
implementing a second sub-domain distinct from the first diagnostic sub-domain, the second diagnostic sub-domain comprising second diagnostic information associating probabilistic second context data to a second product unit based on one or more second parameters measured in relation to the second product unit; and
implementing a probabilistic connection between the first context data and the second product unit.

23. A method of obtaining diagnostic information relating to an industrial process, the method comprising:
implementing a first sub-domain comprising first diagnostic information extracted by analysis of first object data, the first object data representing one or more first parameters measured in relation to a first set of product units that have been subjected nominally to the same industrial process as one another;
implementing a second sub-domain comprising second diagnostic information extracted by analysis of second object data, the second object data representing one or more second parameters measured in relation to a second set of product units that have been subjected nominally to the same industrial process as one another;
implementing a network comprising at least one probabilistic connection from a first variable in the first diagnostic sub-domain to a second variable in the second diagnostic sub-domain, whereby the second diagnostic information is influenced probabilistically by knowledge within the first diagnostic information.

24. A method according to clause 23, wherein said network comprises a directed acyclic graph.

25. A method according to clause 23 or 24, wherein said network includes one or more further probabilistic connections between variables within the first and/or within second sub-domain.

26. A method according to clause 23, 24 or 25, wherein one or more Bayesian inference steps are performed using the network so that a variable within the first sub-domain is influenced by propagation of belief from within the second sub-domain.

27. A method according to any of clauses 23 to 26, wherein the first variable represents a spatial fingerprint observed in the first object data.

28. A method according to clause 27, wherein the said spatial fingerprint is derived by performing a multivariate analysis on the first object data.

29. A method according to any of clauses 23 to 28, wherein the first variable comprises a piece of context data representing a parameter of the industrial process as applied to each individual product unit.

30. A method according to clause 29, wherein in the first diagnostic sub-domain the system is arranged to extract said first diagnostic information at least partly by identifying correlation between a spatial fingerprint observed in said first object data and said piece of the context data.

31. A method according to any of clauses 23 to 30, wherein the second variable represents a spatial fingerprint in the second object data.

32. A method according to any of clauses 23 to 31, wherein the first variable forms an explanation node within the first diagnostic sub-domain.

33. A method according to any of clauses 23 to 32, wherein the second variable forms an explanation node within the second diagnostic sub-domain.

34. A method according to any of clauses 27 to 33, wherein the significance of a spatial fingerprint in the first sub-domain is reduced based on diagnostic information obtained in the second sub-domain.

35. A method according to any of clauses 22 to 34, wherein the significance of certain measurements used in the first sub-domain is selectively reduced based on diagnostic information obtained in the second sub-domain.

36. A method according to any of clauses 23 to 35, wherein said industrial process comprises a sequence of one or more lithographic processing steps performed on product units in the form of substrates, and wherein said first variable and/or said second variable include positional deviations that are measured automatically at locations spatially distributed across each substrate in performance of said lithographic patterning operation.

37. A method according to clause 36, wherein said object data includes spatially distributed measurements of one or more of overlay, critical dimension, side wall angle, wafer quality, focus.

38. A method according to any of clauses 23 to 37, wherein the analysis in at least one of the first and second sub-domains further includes performance data representing one or more performance parameters measured for each product unit.

39. A method according to any of clauses 23 to 38, wherein the analysis in at least one of the first and second sub-domains further includes context data representing one or more parameters of the industrial process as applied to each individual product unit, the method further comprising extracting diagnostic information using said context data.

40. A method according to clause 39, wherein, by operation of said probabilistic connections, an analysis based context data in one of the first and second sub-domains is propagated into the other of said sub-domains.

41. A method according to clause 39 or 40, wherein said diagnostic information is extracted at least partly by identifying correlation between the identification of product units as being of interest based on said component vectors and one or more parameters in the context data.

42. A method according to any of clauses 22 to 41, wherein said industrial process includes performing one or more lithographic, physical and/or chemical operations by different individual processing apparatuses on different individual product units, and wherein said context data includes at least one parameter identifying the individual processing apparatus used for a given operation.

43. A method of controlling a lithographic apparatus wherein corrections are applied based on diagnostic information extracted from object data using a diagnostic system according to any of clauses 1 to 21, or a method according to any of clauses 22 to 42.

44. A controller for a lithographic apparatus, the controller including a diagnostic system according to any of clauses 1 to 21, the controller being arranged to use diagnostic information extracted from object data using the diagnostic system to apply corrections in the applying a pattern to a substrate.

45. A method of controlling an industrial process in which product units are subjected to one or more processing operations, the method comprising the steps of:
measuring a plurality of product units that have been subjected to some or all of said processing operations to obtain object data representing for each product unit one or more parameters measured on the product unit at points spatially distributed across the product unit;
using said object data to obtain diagnostic information using a diagnostic system according to any of clauses 1 to 21 and/or a method according to any of clauses 22 to 43; and
controlling the performance of said industrial process for subsequent product units based on the extracted diagnostic information.

46. A method according to clause 45, wherein said industrial process is a lithographic process for the manufacture of semiconductor devices, the processing operations including lithographic pattering operations and one or more physical and/or chemical processing operations, the product units comprising substrates, wherein the object data includes alignment data measured from said substrates in the course of at least one of said lithographic pattering operations.

47. A method according to clause 45 or 46, wherein said industrial process is a lithographic process for the manufacture of semiconductor devices, the processing operations including lithographic pattering operations and one or more physical and/or chemical processing operations, the product units comprising substrates, wherein the step of controlling the performance of the industrial process includes selectively applying alignment corrections in at least one of said lithographic pattering operations.

48. A method according to clause 45, 46 or 47, wherein said industrial process is a lithographic process for the manufacture of semiconductor devices, the processing operations including lithographic pattering operations and one or more physical and/or chemical processing operations, the product units comprising substrates, wherein the object data includes at least one performance parameter measured from said substrates after performance of at least one of said lithographic pattering operations.

49. A control system for an industrial process in which product units are subjected to one or more processing operations, the controller comprising:
storage for object data representing one or more parameters measured on a plurality of product units that have been subjected to some or all of said processing operations, said parameters being measured at points spatially distributed across the product unit;
a processor for using said object data to obtain diagnostic information by a method according to any of clauses 22 to 43 and 45 to 48; and
a controller for controlling the performance of said industrial process for subsequent product units based on the extracted diagnostic information.

50. A computer program product comprising machine readable instructions for causing a general purpose data processing apparatus to implement a diagnostic system according to any of clauses 1 to 21 and 44 and/or a method according to any of clauses 22 to 43 and 45 to 48 and/or the processor of a control system according to clause 49.

51. A computer program product according to clause 50, further comprising machine readable instructions for causing said data processing apparatus to generate correction data and correction criteria by implementing a diagnostic system according to any of clauses 1 to 21 and 44 and/or a method according to any of clauses 22 to 43 and 45 to 48 and/or a control system according to clause 49.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. As already mentioned, the invention may be applied in industrial processing applications quite separate from lithography. Examples might be in production of optical components, automotive manufacture, and construction—any number of applications where diagnostic systems for a complex process may be based on a number of local models. As in the example of lithography, the set of measurements in one or more sub-domains may be subjected to multivariate analysis.

Although specific reference may have been made above to the use of embodiments of the invention in the context of optical lithography, it will be appreciated that the invention may be used in other types of lithography, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wave-length in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the spirit and scope of the claims set out below. In addition, it should be appreciated that structural features or method steps shown or described in any one embodiment herein can be used in other embodiments as well.

The invention claimed is:

1. A hardware diagnostic system for use in relation to an industrial process, the system implementing a network comprising two or more sub-domains implemented as electronic instructions and/or data in one or more non-transitory computer-readable media, each sub-domain being or corresponding to a respective model representing at least part of the industrial process,
wherein at least a first one of the sub-domains comprises first diagnostic information extracted by analysis of first object data, the first object data representing one or more first parameters measured in relation to a first set of product units that have been subjected nominally to the same industrial process as one another,
wherein at least a second one of the sub-domains comprises second diagnostic information extracted by analysis of second object data, the second object data representing one or more second parameters measured in relation to a second set of product units that have been subjected nominally to the same industrial process as one another, and wherein the network further comprises at least one probabilistic connection from a first variable in the first sub-domain to a second variable in the second sub-domain, at least some information of, or used to extract the second diagnostic information being influenced probabilistically by at least some information of, or used to extract, the first diagnostic information.

2. The diagnostic system as claimed in claim 1, wherein the network comprises a directed acyclic graph.

3. The diagnostic system as claimed in claim 1, wherein the network includes one or more further probabilistic connections between variables within the first and/or second sub-domain.

4. The diagnostic system as claimed in claim 1, wherein the diagnostic system is arranged to perform one or more Bayesian inference steps using the network so that a variable within the first sub-domain is influenced by propagation of probability of occurrence from within the second sub-domain.

5. The diagnostic system as claimed in claim 1, wherein the first variable represents a spatial fingerprint observed in the first object data.

6. The diagnostic system as claimed in claim 5, wherein the spatial fingerprint is derived by performing a multivariate analysis on the first object data.

7. The diagnostic system as claimed in claim 1, wherein the first variable comprises a piece of context data representing a parameter of the industrial process as applied to each individual product unit.

8. The diagnostic system as claimed in claim 7, wherein in the first diagnostic sub-domain the system is further arranged to extract the first diagnostic information at least partly by identifying correlation between a spatial fingerprint observed in the first object data and the piece of the context data.

9. The diagnostic system as claimed in claim 5, wherein the significance of a spatial fingerprint in the first sub-domain is reduced based on diagnostic information obtained in the second sub-domain.

10. The diagnostic system as claimed in claim 1, wherein the significance of certain measurements used in the first sub-domain is selectively reduced based on diagnostic information obtained in the second sub-domain.

11. The diagnostic system as claimed in claim 1, configured for use where the industrial process comprises a sequence of one or more lithographic processing steps performed on product units in the form of substrates, and wherein the first variable and/or the second variable include positional deviations that are measured automatically at locations spatially distributed across each substrate in performance of the one or more lithographic processing steps.

12. The diagnostic system as claimed in claim 11, wherein the first and/or second object data includes spatially distributed measurements of one or more selected from: overlay, critical dimension, side wall angle, wafer quality, and/or focus.

13. The diagnostic system as claimed in claim 1, wherein the analysis for the first and/or second sub-domain further includes performance data representing one or more performance parameters measured for each product unit.

14. A method of obtaining diagnostic information relating to an industrial process, the method comprising:
implementing a first sub-domain implemented as electronic instructions and/or data in one or more non-transitory computer-readable media, the first sub-domain being or corresponding to a model representing at least part of the industrial process and comprising first diagnostic information extracted by analysis of first object data, the first object data representing one or more first parameters measured in relation to a first set of product units that have been subjected nominally to the same industrial process as one another;
implementing a second sub-domain implemented as electronic instructions and/or data in one or more non-transitory computer-readable media, the second sub-domain being or corresponding to a model representing at least part of the industrial process and comprising second diagnostic information extracted by analysis of second object data, the second object data representing one or more second parameters measured in relation to a second set of product units that have been subjected nominally to the same industrial process as one another; and
implementing a network comprising at least one probabilistic connection from a first variable in the first diagnostic sub-domain to a second variable in the second diagnostic sub-domain, wherein at least some information of, or used to extract, the second diagnostic information is influenced probabilistically by at least some information of, or used to extract, the first diagnostic information.

15. The method as claimed in claim 14, wherein one or more Bayesian inference steps are performed using the network so that a variable within the first sub-domain is influenced by propagation of probability of occurrence from within the second sub-domain.

16. The method according to claim 14, wherein the network comprises a directed acyclic graph.

17. The method according to claim 14, wherein the network includes one or more further probabilistic connections between variables within the first and/or second sub-domain.

18. A non-transitory computer program product comprising machine readable instructions therein, the instructions, when executed by a data processing system, configured to cause the data processing system to at least:
implement a first sub-domain as electronic instructions and/or data in one or more non-transitory computer-readable media, the first sub-domain being or corresponding to a model representing at least part of an industrial process and comprising first diagnostic information extracted by analysis of first object data, the first object data representing one or more first parameters measured in relation to a first set of product units that have been subjected nominally to the same industrial process as one another;
implement a second sub-domain as electronic instructions and/or data in one or more non-transitory computer-readable media, the second sub-domain being or corresponding to a model representing at least part of an industrial process and comprising second diagnostic information extracted by analysis of second object data, the second object data representing one or more second parameters measured in relation to a second set of product units that have been subjected nominally to the same industrial process as one another; and
implement a network comprising at least one probabilistic connection from a first variable in the first diagnostic sub-domain to a second variable in the second diagnostic sub-domain, wherein at least some information of, or used to extract, the second diagnostic information is influenced probabilistically by at least some information of, or used to extract, the first diagnostic information.

19. The computer program product according to claim 18, further comprising machine readable instructions configured to cause the data processing system to generate correction data and correction criteria based on the first diagnostic information, the second diagnostic information and/or the at least one probabilistic connection.

20. A diagnostic method for an industrial process, the method comprising:
- implementing a first sub-domain as electronic instructions and/or data in one or more non-transitory computer-readable media, the first sub-domain being or corresponding to a model representing at least part of the industrial process and comprising first diagnostic information associating probabilistic first context data to a first product unit based on one or more first parameters measured in relation to the first product unit;
- implementing a second sub-domain distinct from the first sub-domain, the second sub-domain implemented as electronic instructions and/or data in one or more non-transitory computer-readable media, being or corresponding to a model representing at least part of the industrial process, and comprising second diagnostic information associating probabilistic second context data to a second product unit based on one or more second parameters measured in relation to the second product unit; and
- implementing a probabilistic connection between the first context data and the second product unit.

* * * * *